United States Patent
Tanie et al.

(10) Patent No.: US 10,064,310 B2
(45) Date of Patent: Aug. 28, 2018

(54) POWER-MODULE DEVICE, POWER CONVERSION DEVICE, AND METHOD FOR MANUFACTURING POWER-MODULE DEVICE

(71) Applicant: Hitachi, Ltd., Chiyoda-ku, Tokyo (JP)

(72) Inventors: Hisashi Tanie, Tokyo (JP); Eiichi Ide, Tokyo (JP); Hiroshi Shintani, Tokyo (JP); Atsuo Nishihara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/319,640

(22) PCT Filed: Jun. 25, 2014

(86) PCT No.: PCT/JP2014/066767
§ 371 (c)(1),
(2) Date: Dec. 16, 2016

(87) PCT Pub. No.: WO2015/198411
PCT Pub. Date: Dec. 30, 2015

(65) Prior Publication Data
US 2017/0325360 A1    Nov. 9, 2017

(51) Int. Cl.
*H05K 7/20*     (2006.01)
*H05K 13/00*    (2006.01)
(Continued)

(52) U.S. Cl.
CPC ....... *H05K 7/20418* (2013.01); *H05K 5/0247* (2013.01); *H05K 5/062* (2013.01); *H05K 13/0023* (2013.01)

(58) Field of Classification Search
None
See application file for complete search history.

(56) References Cited

U.S. PATENT DOCUMENTS 5,373,418 A * 12/1994 Hayasi ............... H01L 23/4006
                                                          257/718
7,633,758 B2 * 12/2009 Oohama ............... H01L 25/117
                                                          257/713
(Continued)

FOREIGN PATENT DOCUMENTS

JP          53-4870 U     1/1978
JP          56-16943 U    2/1981
(Continued)

OTHER PUBLICATIONS

International Search Report (PCT/ISA/210) issued in PCT Application No. PCT/JP2014/066767 dated Jul. 22, 2014 with English-language translation (four (4) pages).

*Primary Examiner* — Courtney Smith
(74) *Attorney, Agent, or Firm* — Crowell & Moring LLP

(57) ABSTRACT

In order to efficiently cool a heat-generating semiconductor element, it is desirable to cool a power semiconductor element from both surfaces. Therefore, in order to cool multiple power semiconductor elements, it is an effective way to alternately arrange a semiconductor component having the incorporated semiconductor element and a cooling device. A power conversion device for handling a high-power voltage needs to ensure pressure resistance between semiconductor elements or circuits inside the device. It is an effective way to seal the semiconductor component with a sealing material such as a silicone gel. Therefore, it is necessary to install the semiconductor component or the circuit having the incorporated semiconductor element, in a case from which a liquid silicone gel prior to curing does not leak even if the gel is injected. For these reasons, an object to be achieved by the invention is that the semiconductor element can be cooled from both surfaces by alternately arranging the semiconductor component having the incorporated semiconductor element and the cooling (Continued)

1 CASE
2 SEALING MATERIAL (GEL)
3 EXTERNAL TERMINAL
4 TERMINAL BLOCK
5 COOLING DEVICE
6 PRESSURIZING BOLT
7 PRESSURIZING PLATE
8 PRESSURIZING NUT
9 TERMINAL BLOCK SUPPORT MEMBER device. The above-described object can be achieved as follows. A substantially rectangular thin plate is subjected to mountain bending and valley bending so as to form a shape having as many recesses as the number of the mounted semiconductor components having the incorporated semiconductor element. Concurrently, a lateral side in a direction orthogonal to the above-described bending direction is bent so as to dispose the case in which all edges configuring an outer shape of the thin plate are arranged on substantially the same plane. The semiconductor component having the incorporated semiconductor element is arranged at a position serving as the recess of the case. The cooling devices are arranged so as to interpose the semiconductor component having the incorporated semiconductor element via the case. The semiconductor component having the incorporated semiconductor element is sealed with a silicone gel. In addition, preferably, the case is configured to include metal which has high heat conductivity. More preferably, the case is configured to include aluminum, copper, or an alloy whose principal components are both of these.

6 Claims, 29 Drawing Sheets

(51) Int. Cl.
*H05K 5/06* (2006.01)
*H05K 5/02* (2006.01)

(56) References Cited

U.S. PATENT DOCUMENTS

| | | | | |
|---|---|---|---|---|
| 8,670,237 | B2* | 3/2014 | Hatai | H05K 7/20409 |
| | | | | 165/80.3 |
| 9,078,376 | B2* | 7/2015 | Nishihara | H01L 23/367 |
| 9,704,777 | B2* | 7/2017 | Nakagawa | H01L 23/4012 |
| 9,723,764 | B2* | 8/2017 | Sugita | H05K 7/20927 |
| 2005/0133210 | A1 | 6/2005 | Inagaki et al. | |
| 2005/0259402 | A1* | 11/2005 | Yasui | H02M 7/003 |
| | | | | 361/716 |
| 2006/0284308 | A1* | 12/2006 | Harada | H01L 25/072 |
| | | | | 257/729 |
| 2012/0008280 | A1* | 1/2012 | Tokuyama | H02M 7/003 |
| | | | | 361/689 |
| 2014/0313671 | A1* | 10/2014 | Sugita | H05K 7/20927 |
| | | | | 361/700 |
| 2016/0073556 | A1* | 3/2016 | Nakasaka | H01L 23/473 |
| | | | | 361/699 |

FOREIGN PATENT DOCUMENTS

| | | |
|---|---|---|
| JP | 5-31248 U | 4/1993 |
| JP | 5-235221 A | 9/1993 |
| JP | 2005-237141 A | 9/2005 |
| JP | 2006-5014 A | 1/2006 |
| JP | 2010-135697 A | 6/2010 |
| JP | 2011-181687 A | 9/2011 |

* cited by examiner

[Fig. 1]
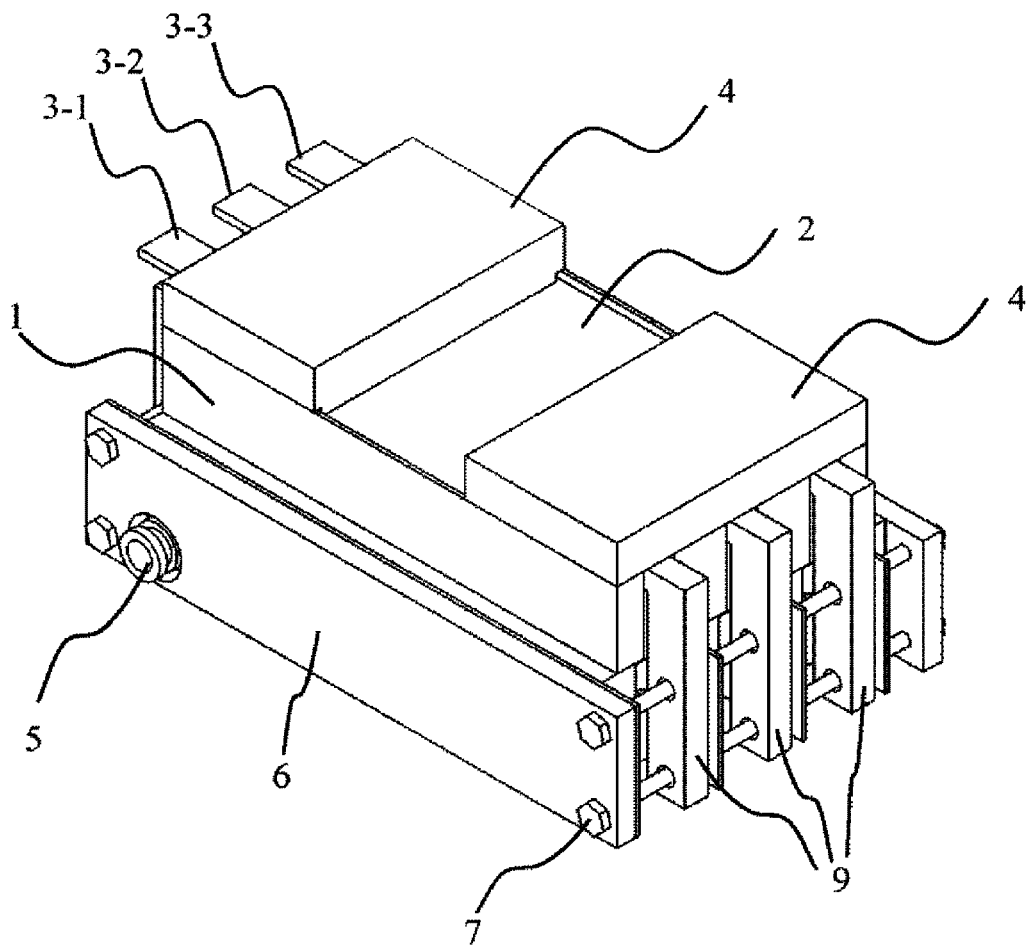
1 CASE
2 SEALING MATERIAL (GEL)
3 EXTERNAL TERMINAL
4 TERMINAL BLOCK
5 COOLING DEVICE
6 PRESSURIZING PLATE
7 PRESSURIZING BOLT
8 PRESSURIZING NUT
9 TERMINAL BLOCK SUPPORT MEMBER

[Fig. 2]
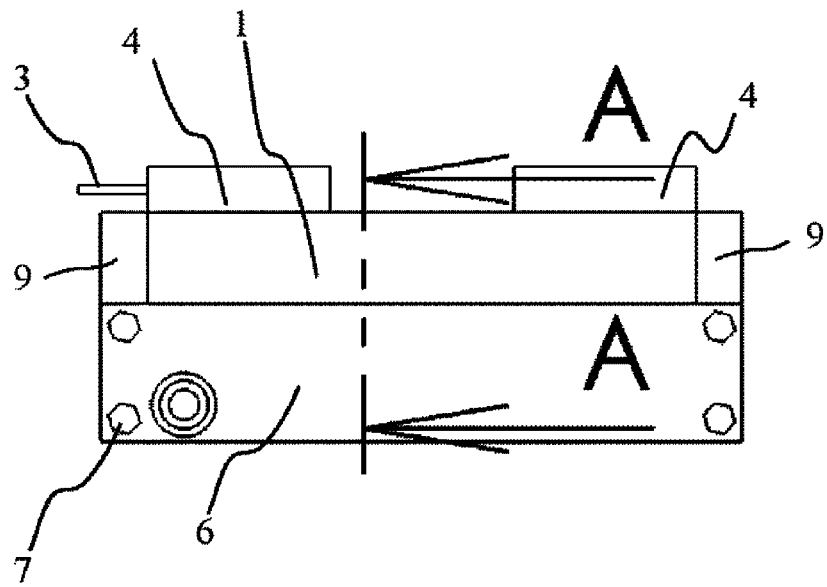
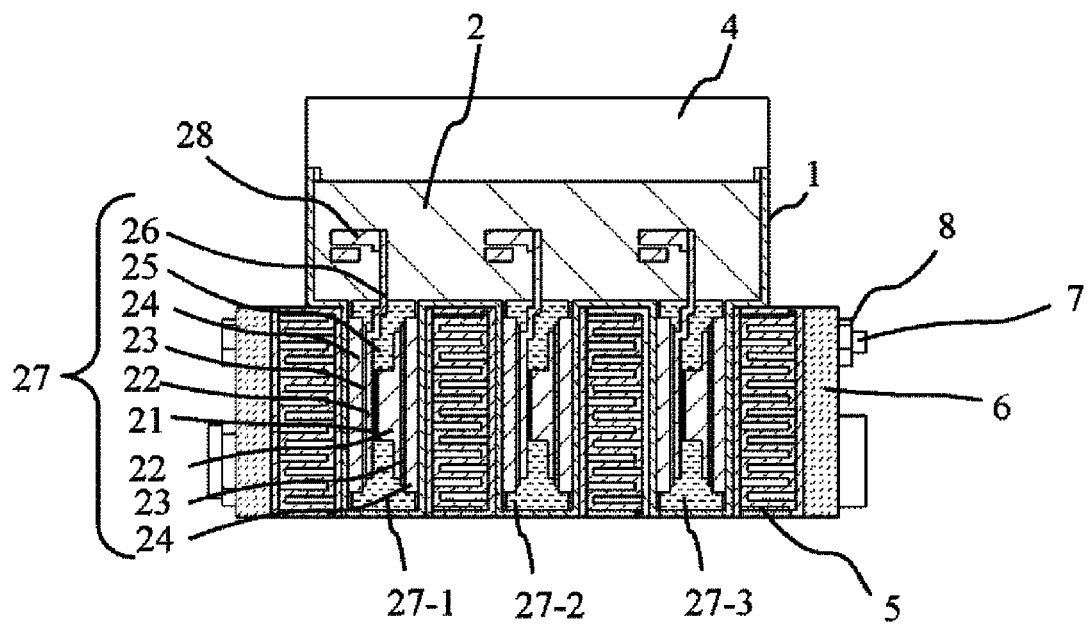
SECTIONAL VIEW TAKEN ALONG LINE A-A

SECTIONAL VIEW TAKEN ALONG LINE B-B

FIG. 4A
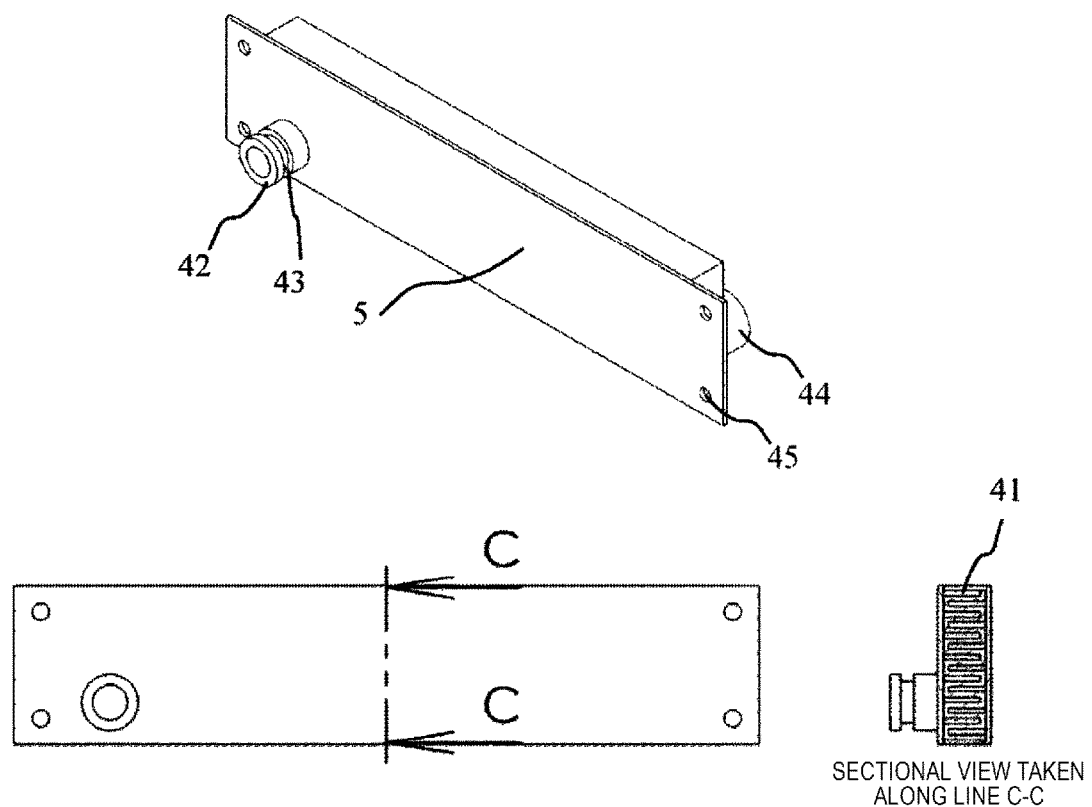
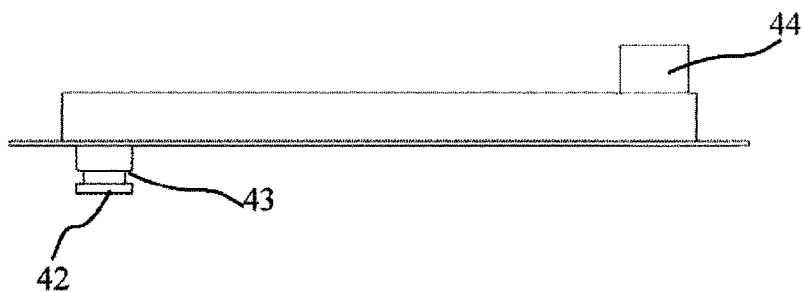

FIG. 4B
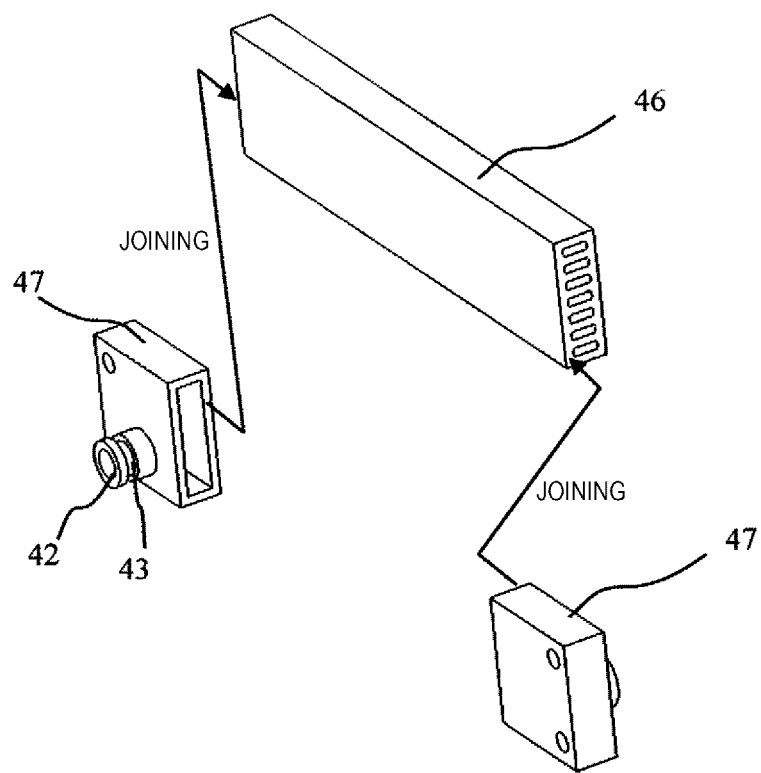
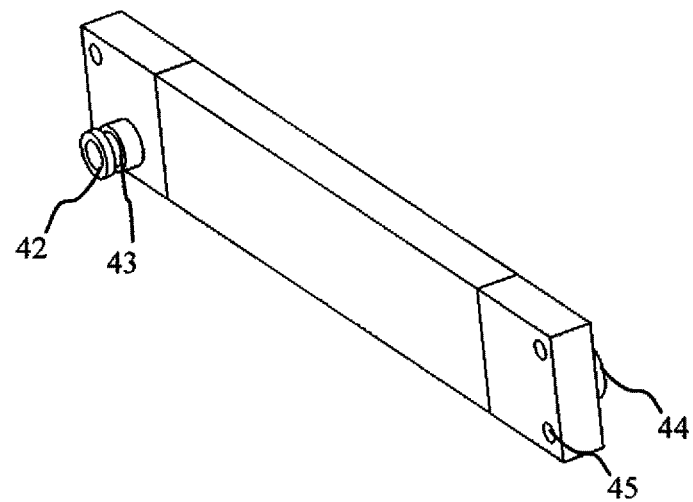

[Fig. 5]
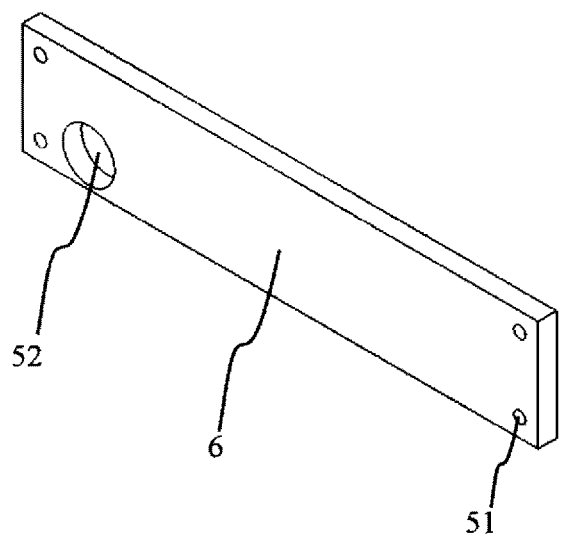
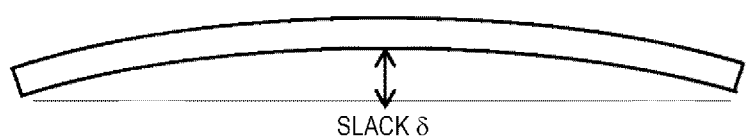
SLACK δ
PRESSURIZING PLATE

[Fig. 6]
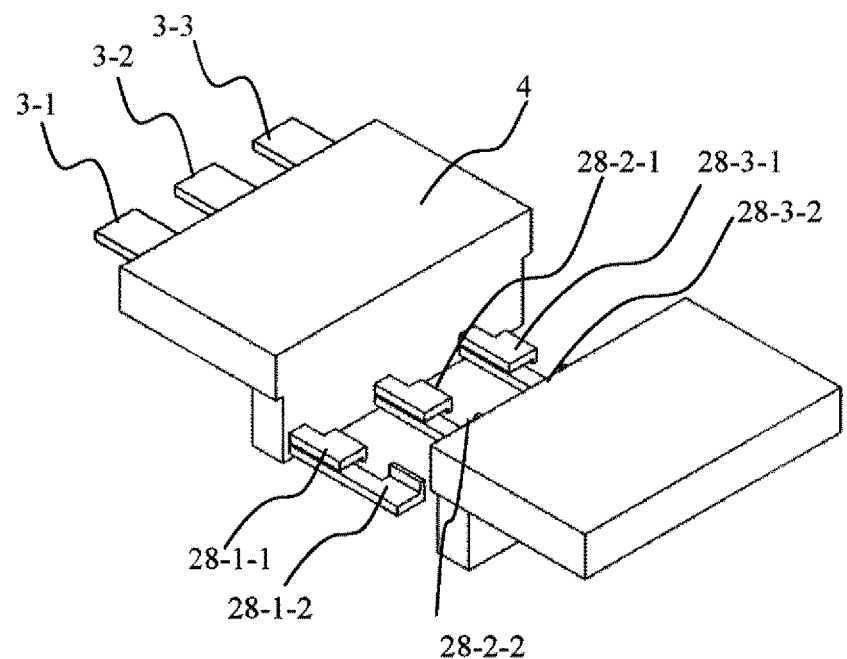
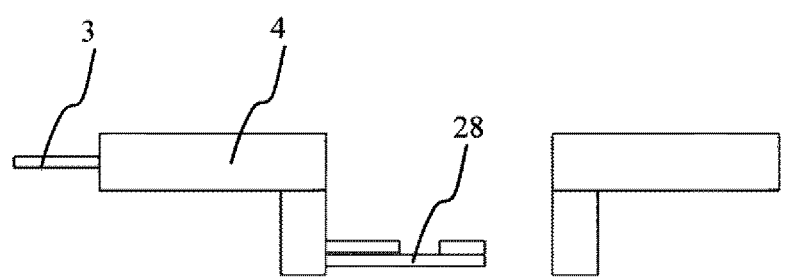
TERMINAL BLOCK

[Fig. 7]
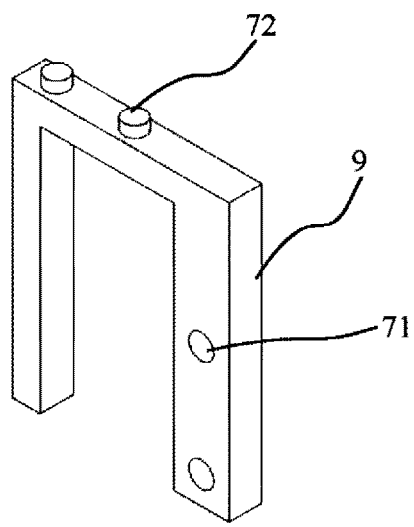

[Fig. 8]
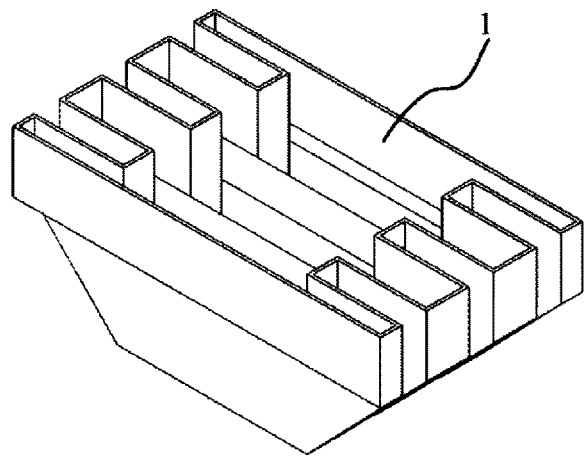
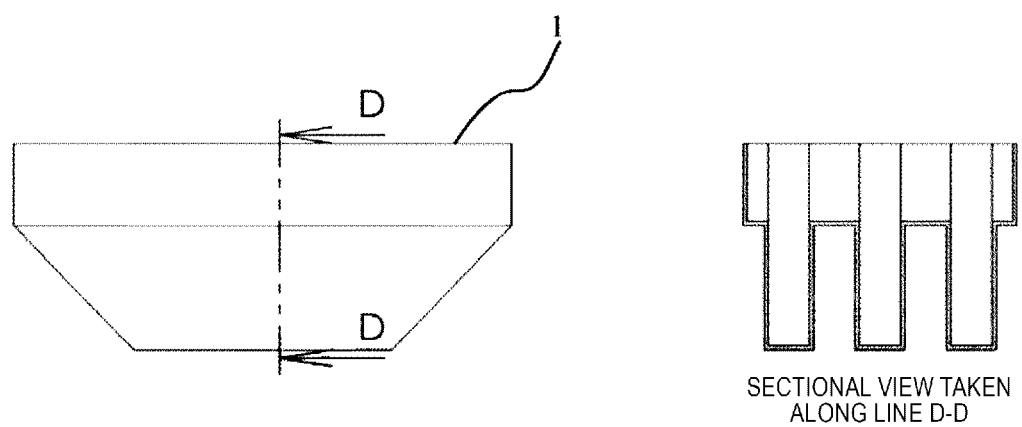
SECTIONAL VIEW TAKEN
ALONG LINE D-D
CASE

[Fig. 9]
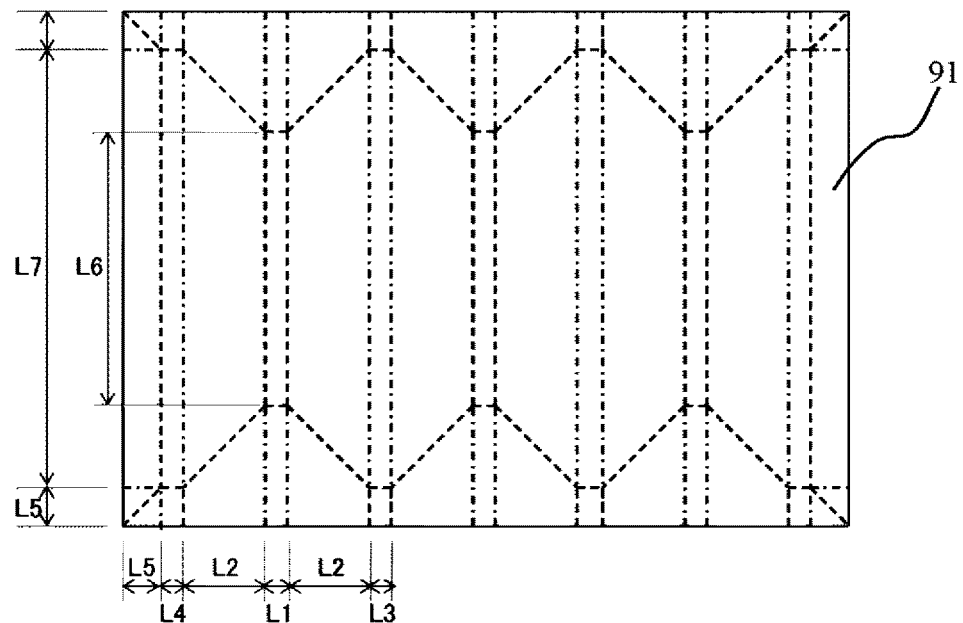
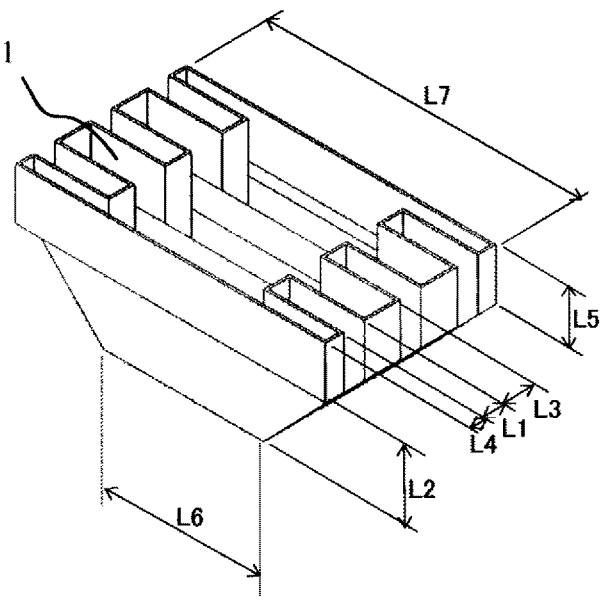
METHOD FOR MANUFACTURING CASE

[Fig. 10]
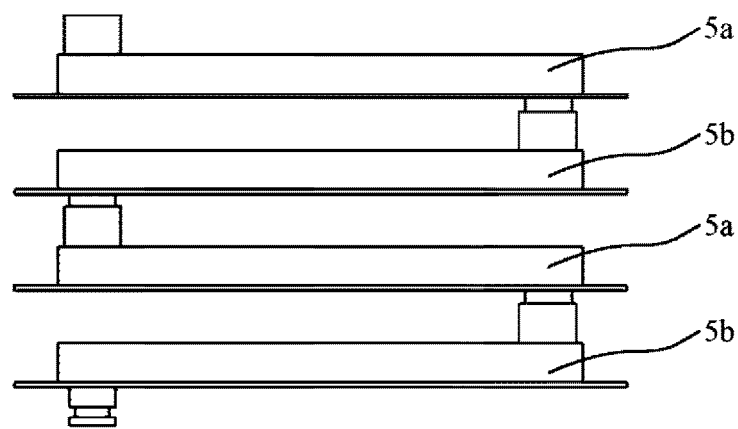
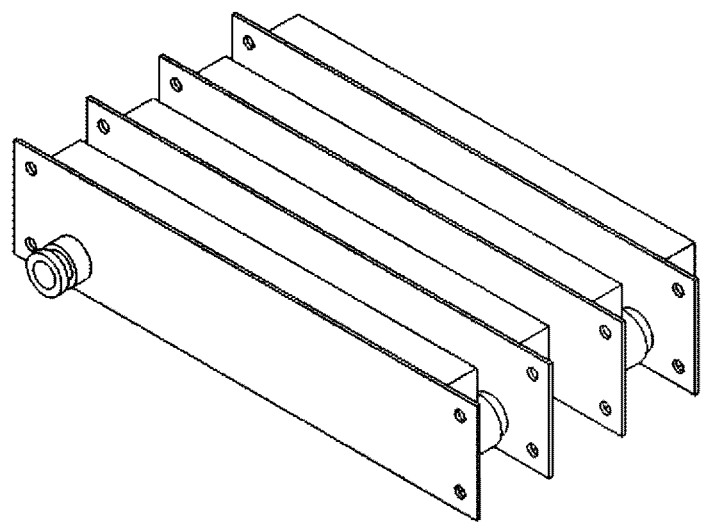
CONNECTION STATE OF COOLING MODULE

[Fig. 13]
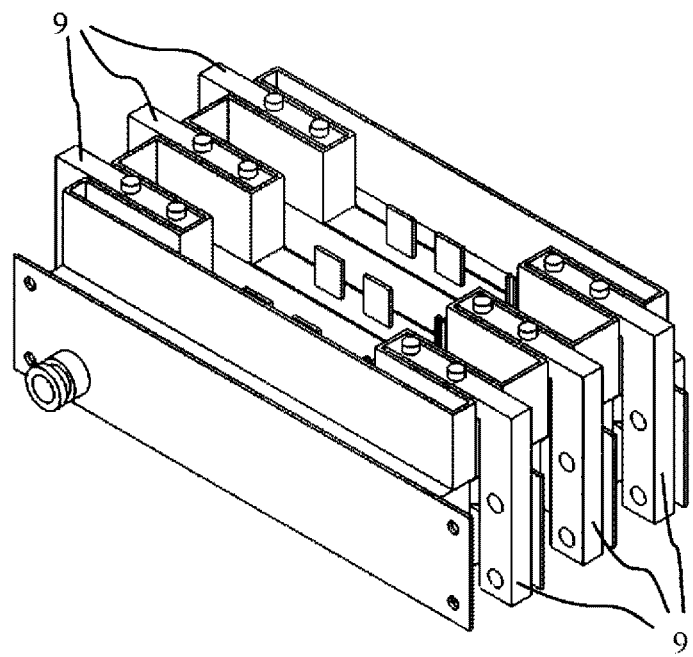
[Fig. 14]
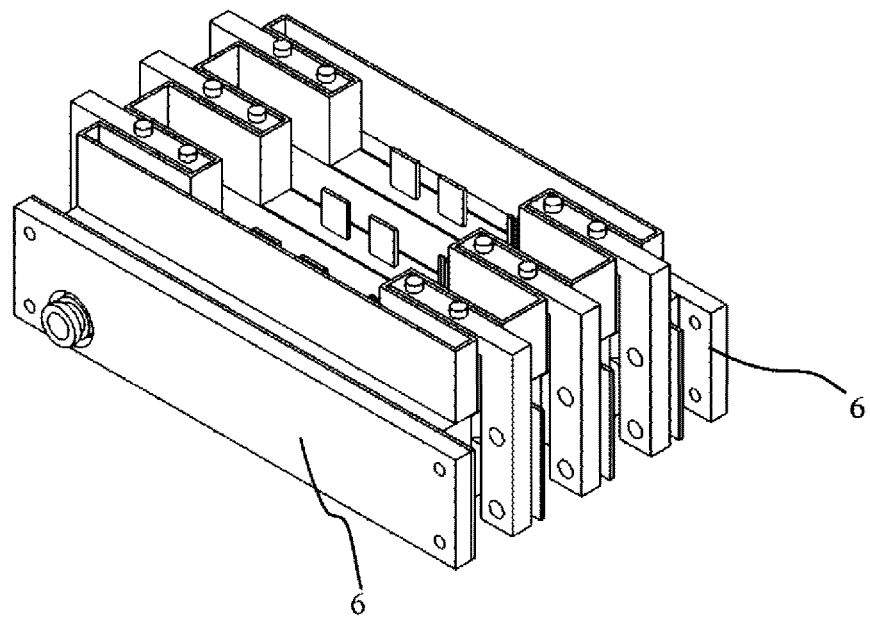

[Fig. 15]
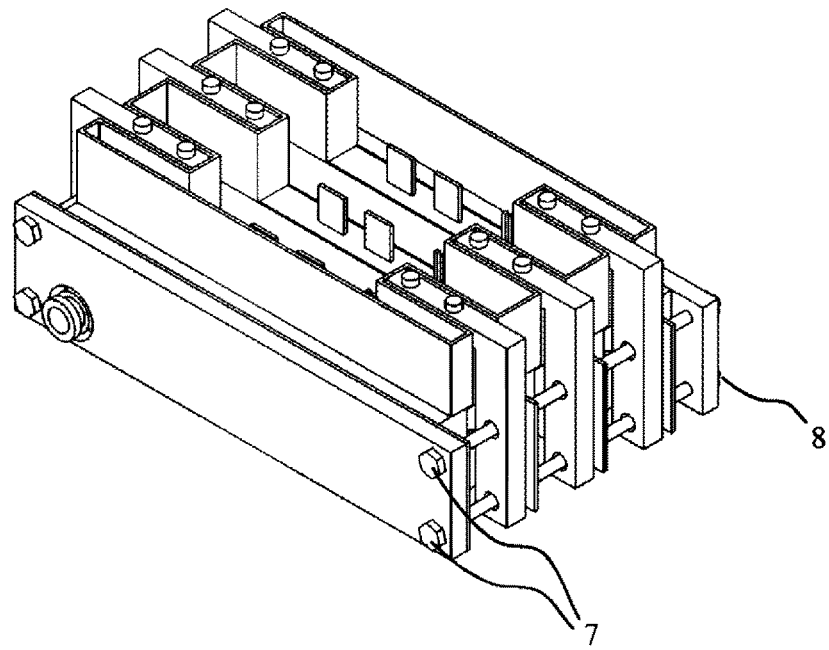
[Fig. 16]
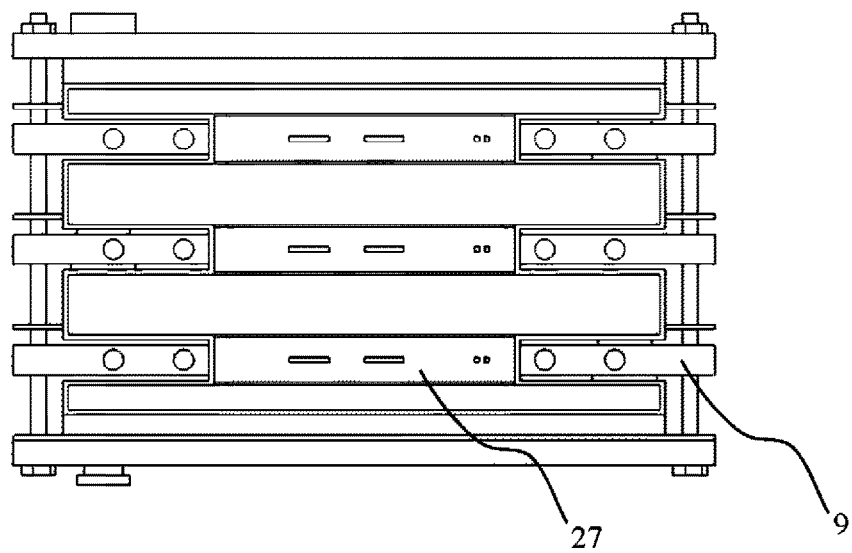

[Fig. 17]
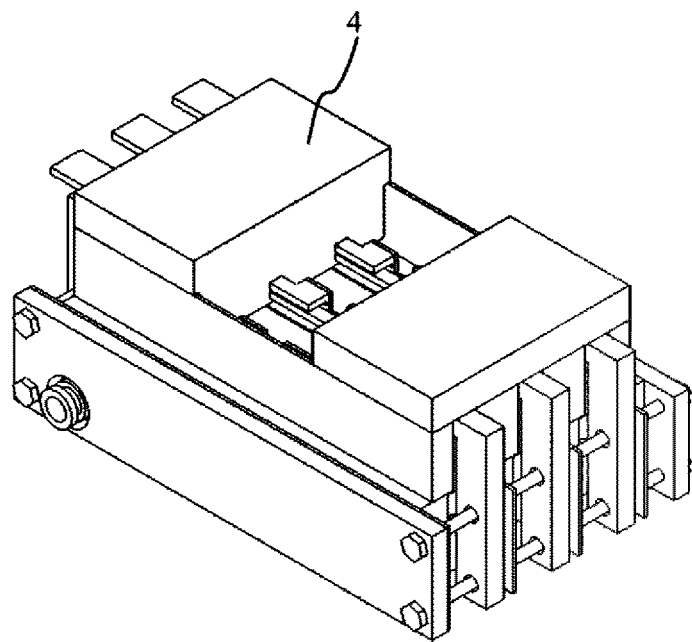
[Fig. 18]
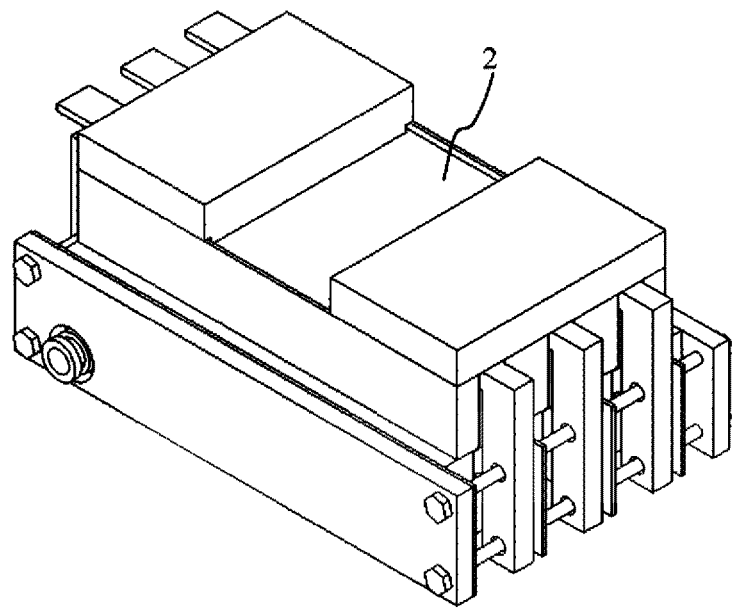
CASE SEALING

[Fig. 21]
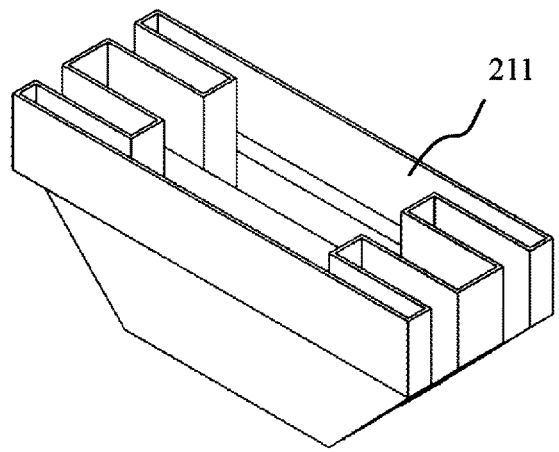
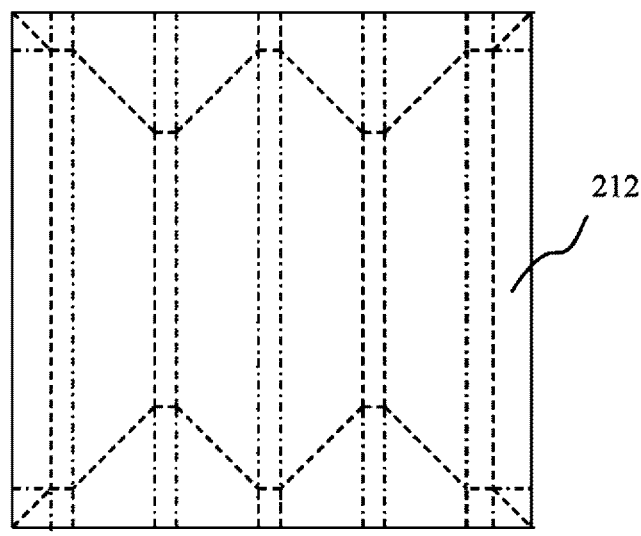

[Fig. 22]
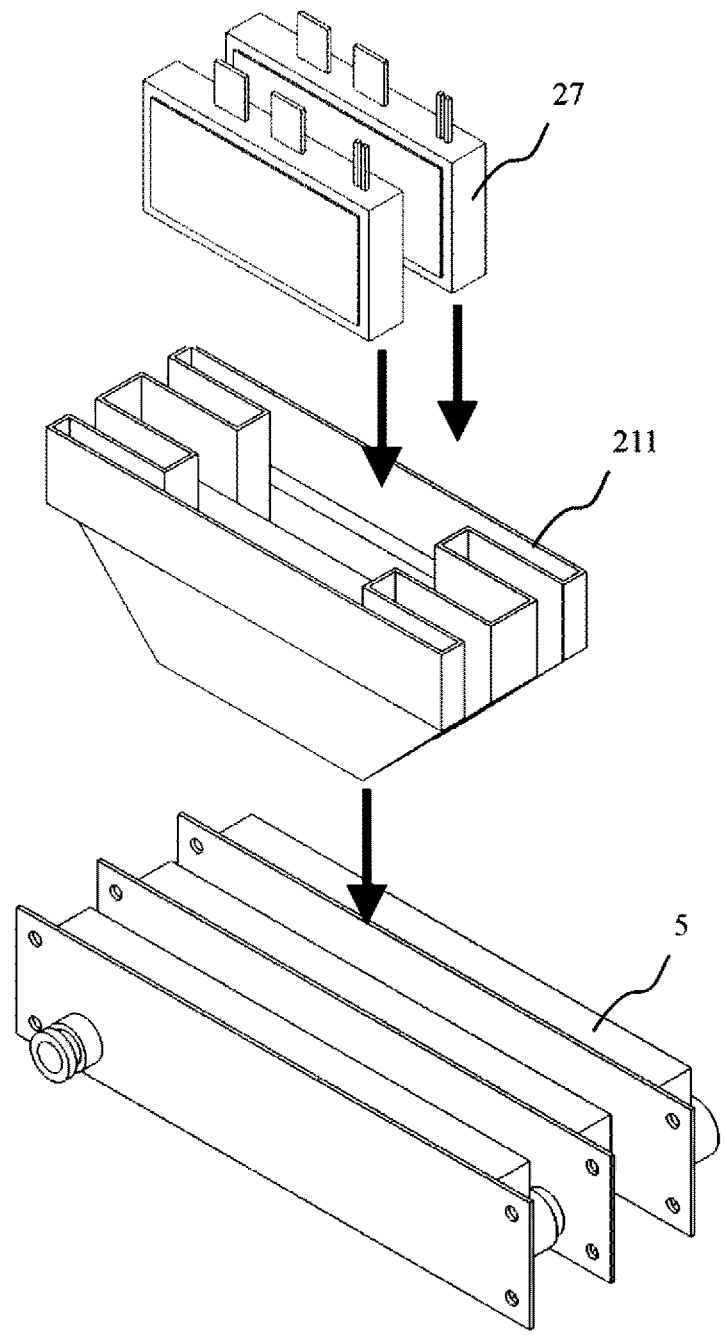

FIG. 23A
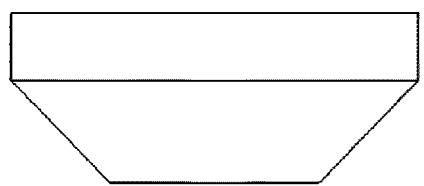
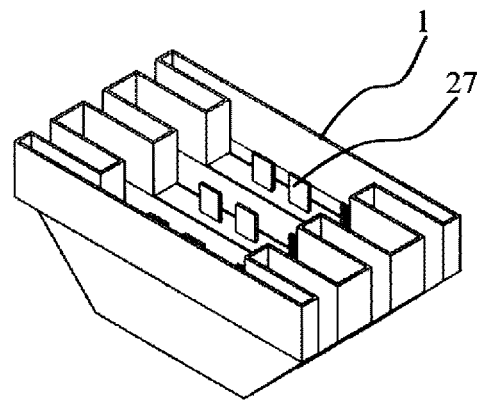
FIG. 23B
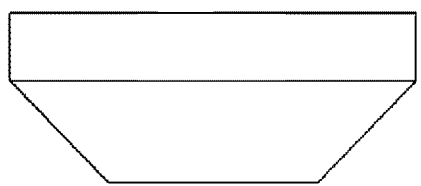
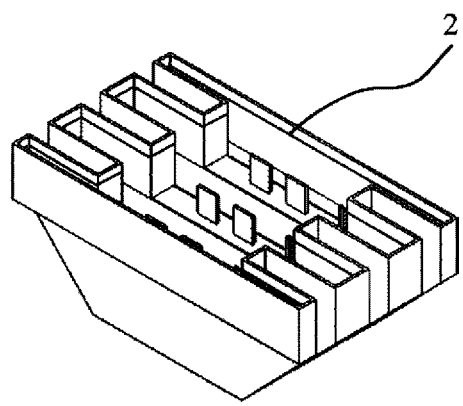
FIG. 23C
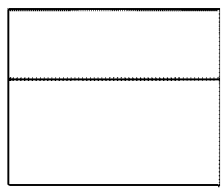
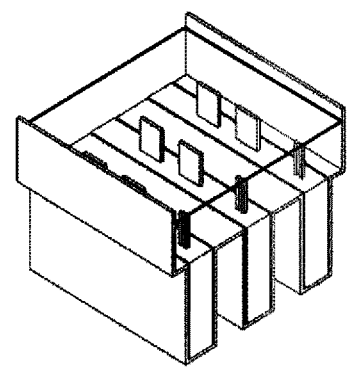

[Fig. 24]
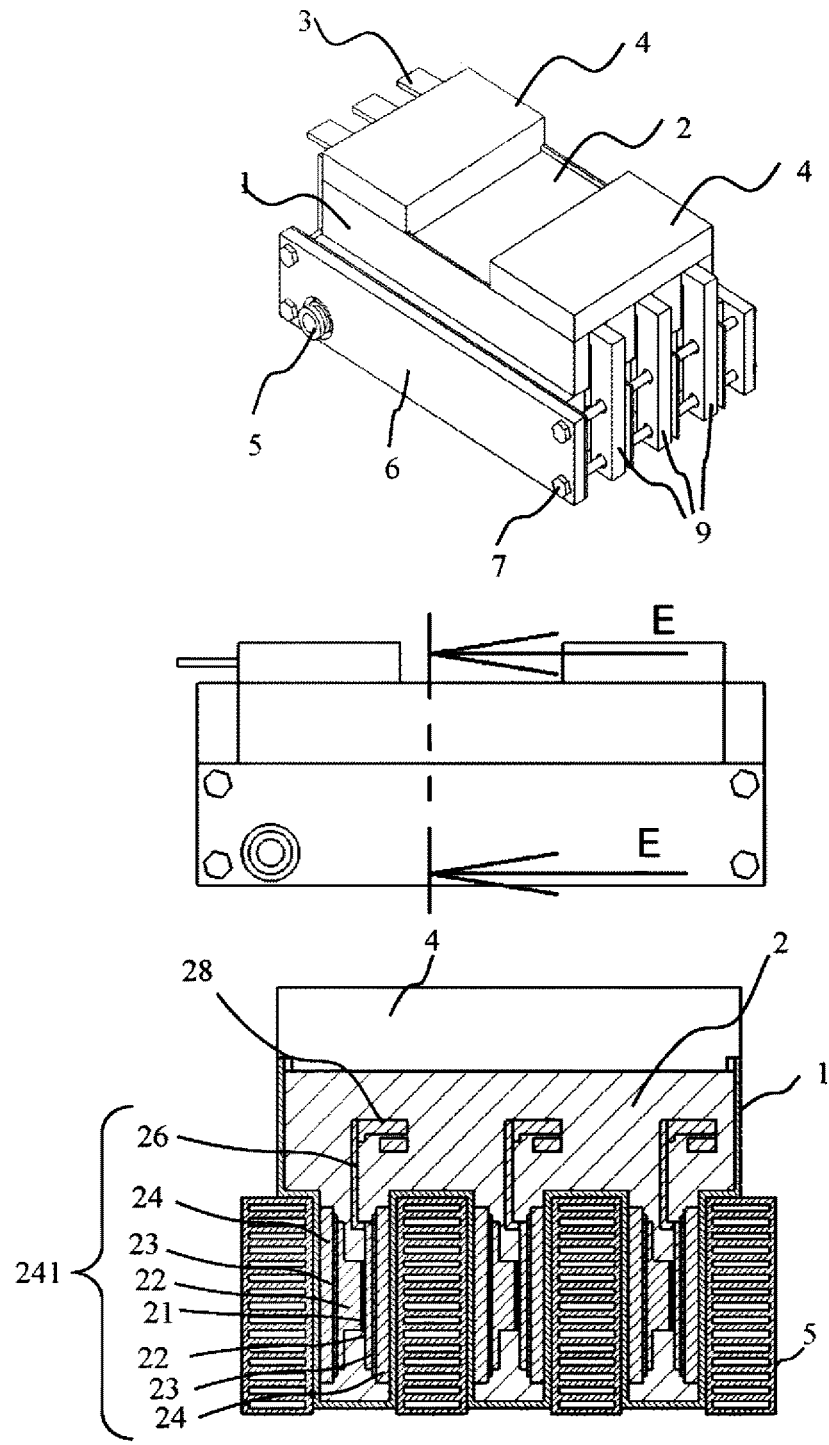
SECTIONAL VIEW TAKEN ALONG LINE E-E

[Fig. 25]
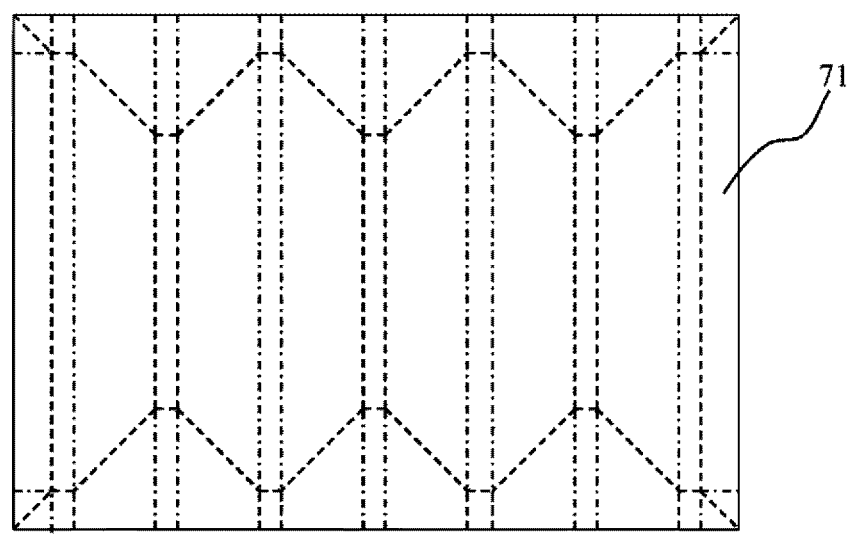
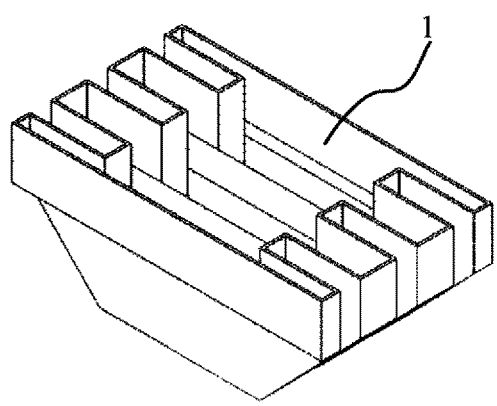

[Fig. 26]
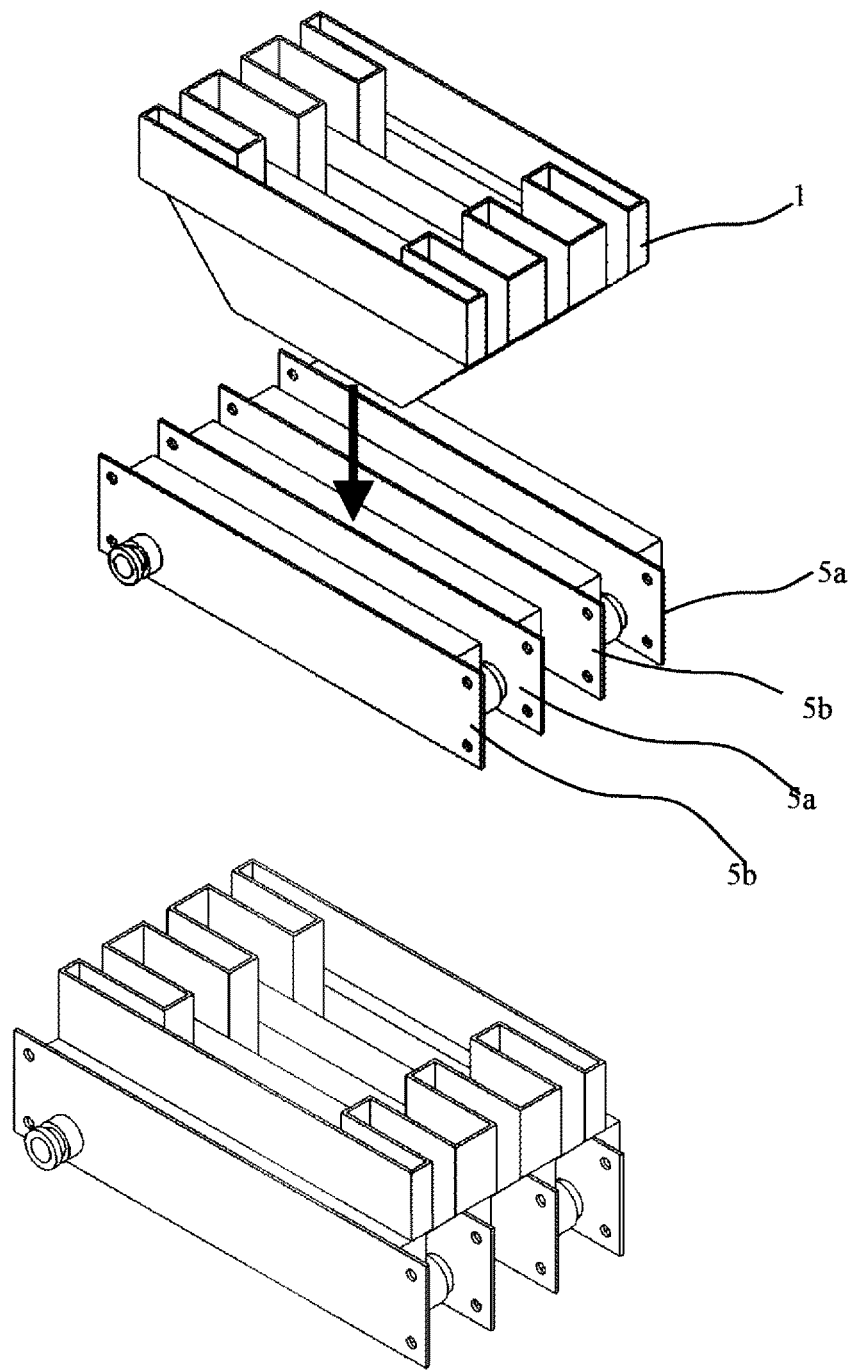

[Fig. 27]
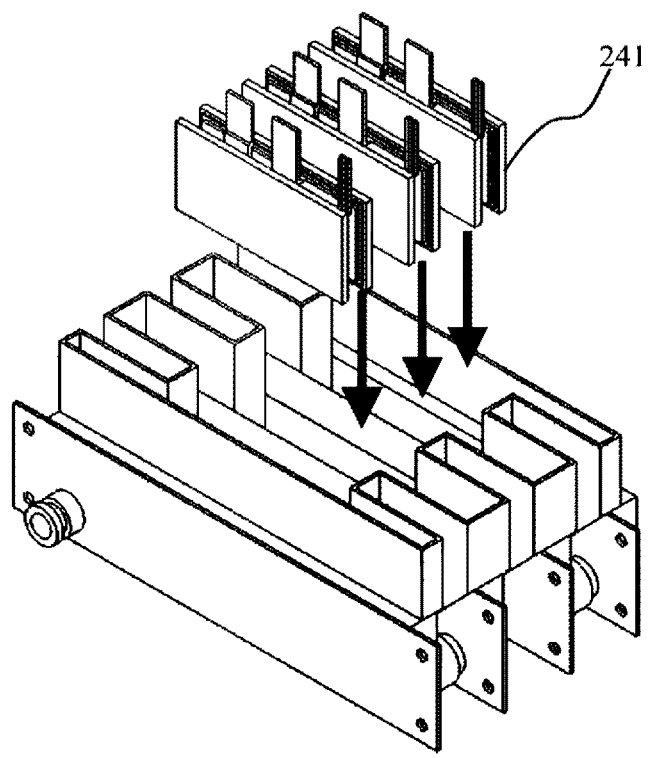
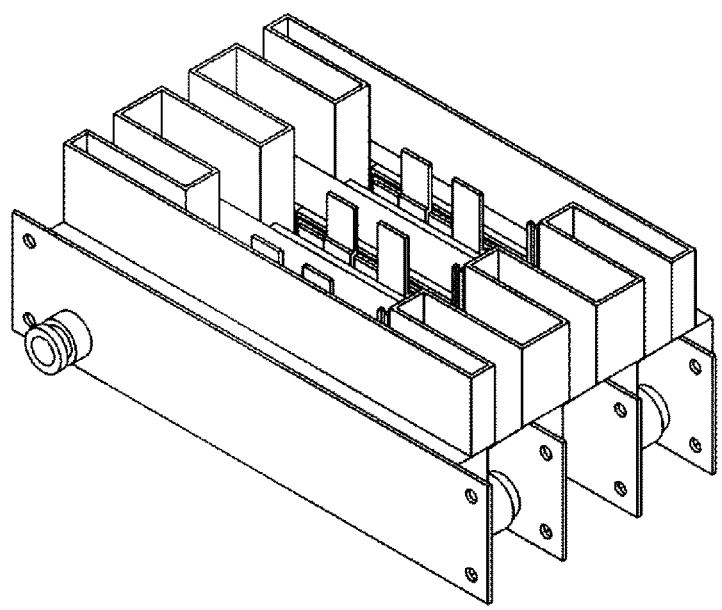

[Fig. 28]
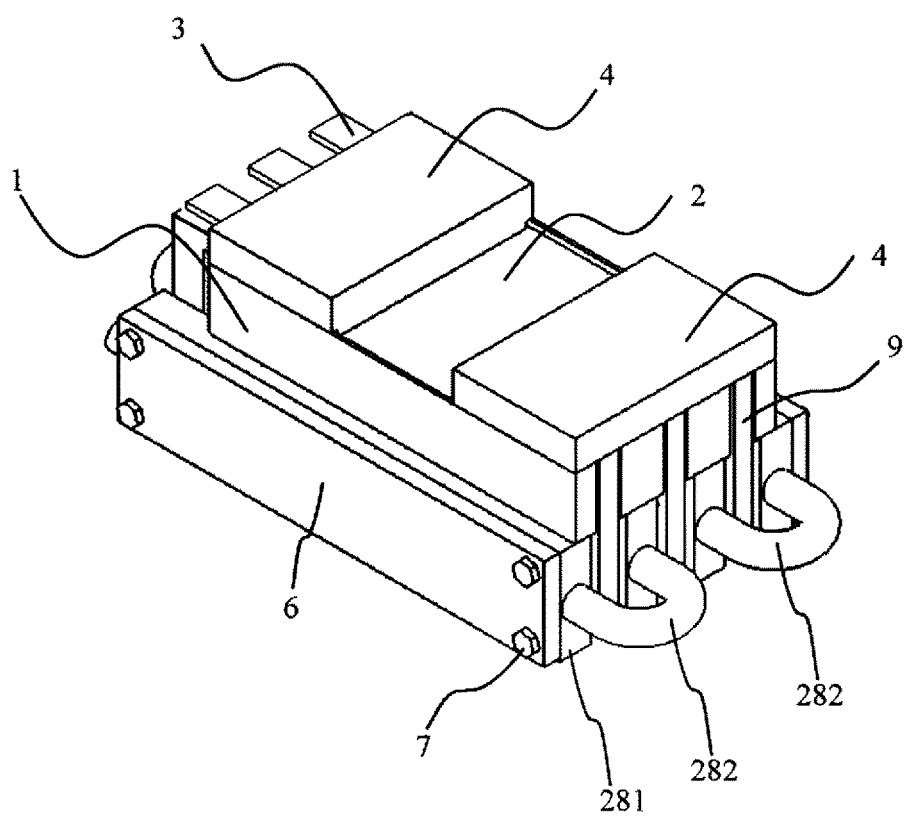

[Fig. 29]
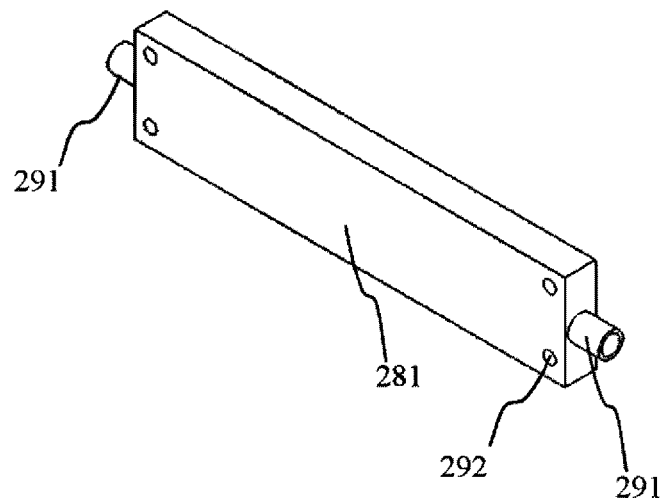
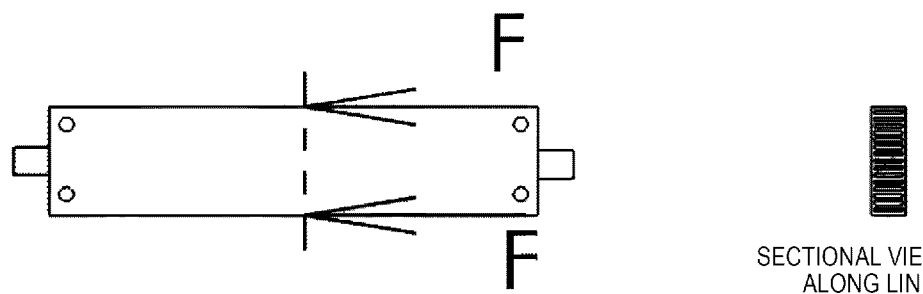
SECTIONAL VIEW TAKEN
ALONG LINE F-F

[Fig. 30]
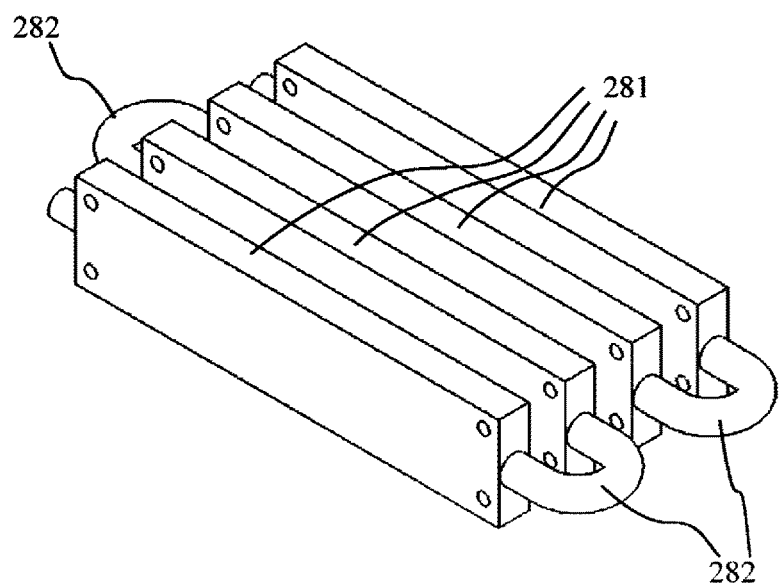
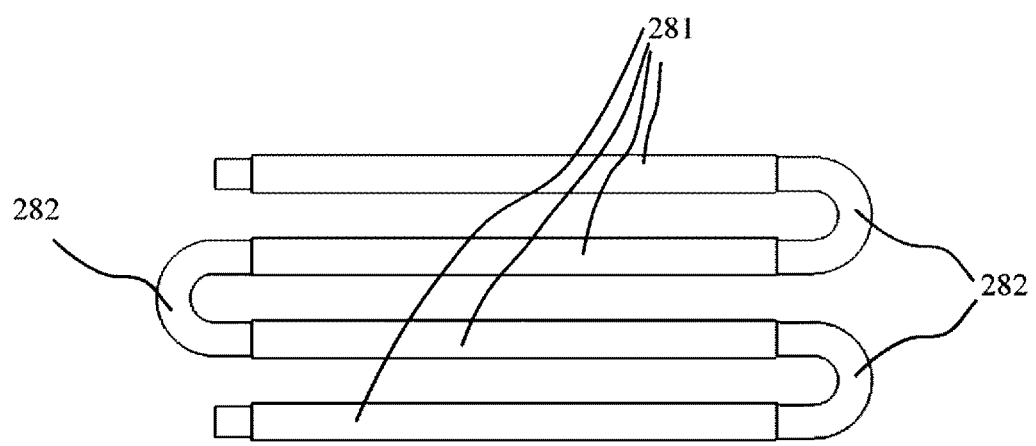

[Fig. 31]
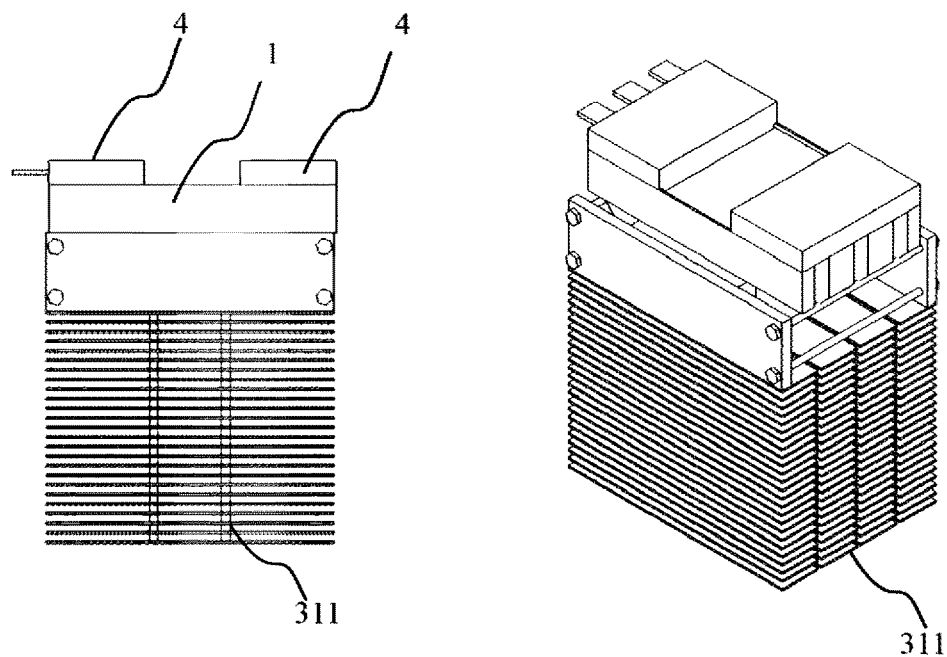
[Fig. 32]
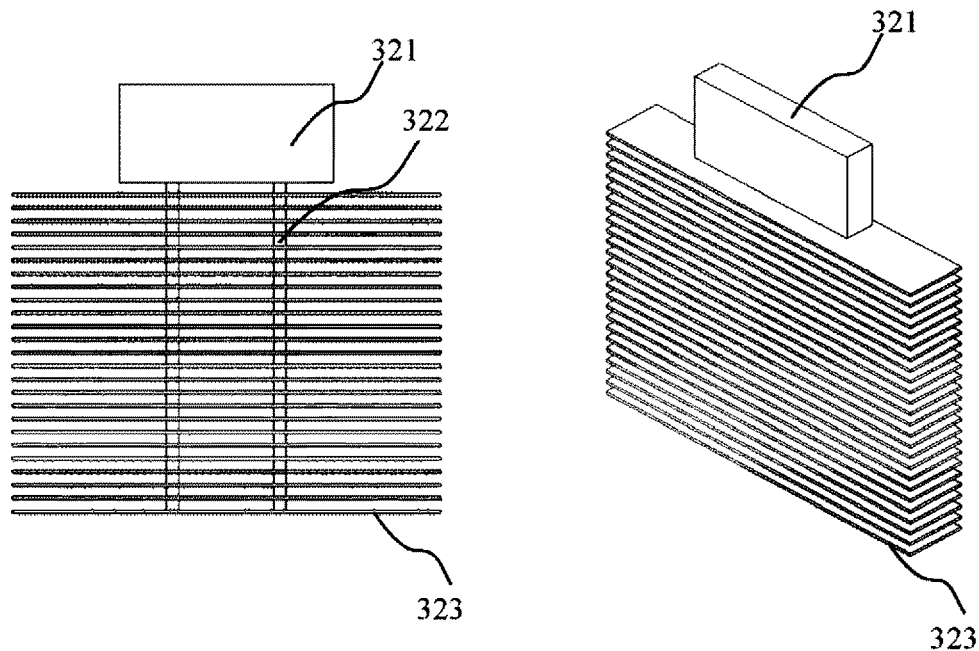

[Fig. 33]
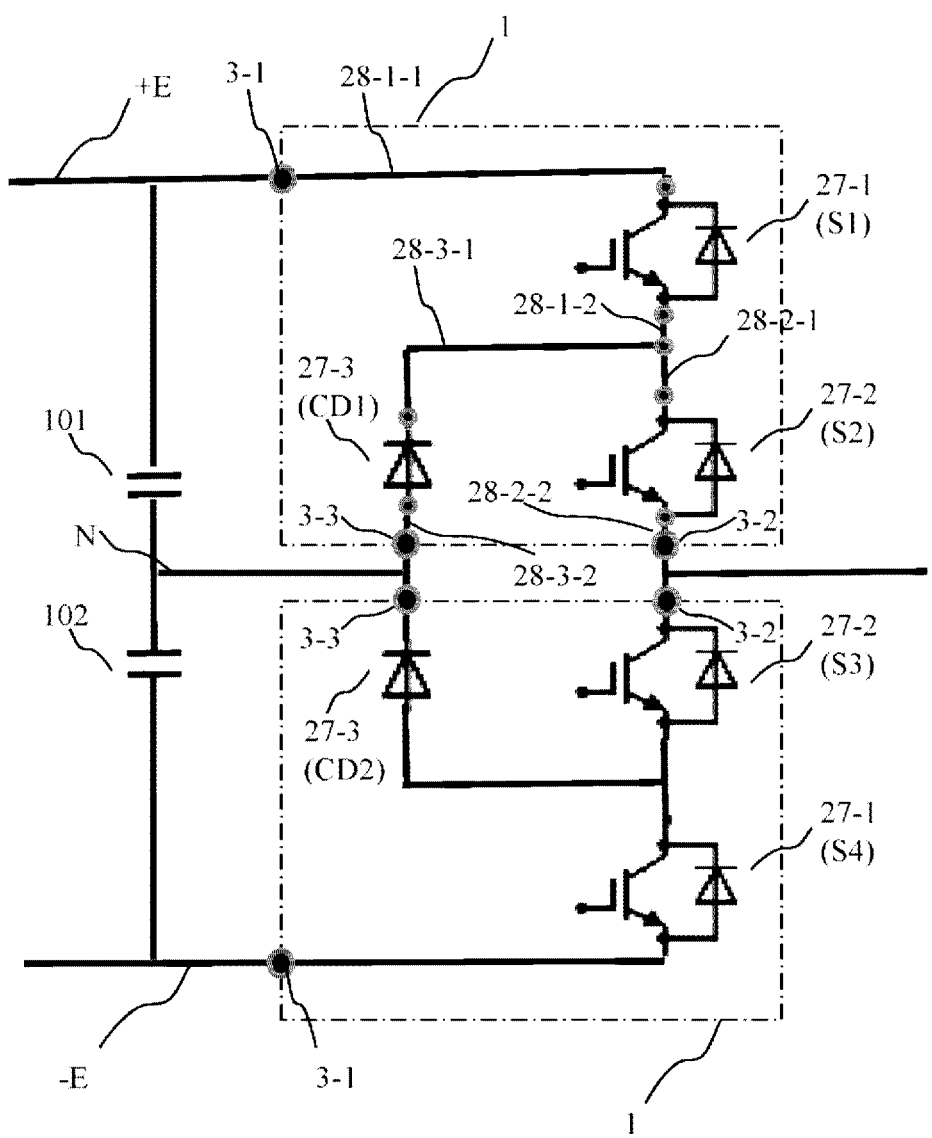

POWER-MODULE DEVICE, POWER CONVERSION DEVICE, AND METHOD FOR MANUFACTURING POWER-MODULE DEVICE

TECHNICAL FIELD

The present invention relates to a power-module device, a power conversion device, and a method for manufacturing a power-module device.

BACKGROUND ART

A power conversion device equipped with a power semiconductor element such as an insulated gate bipolar transistor (IGBT) and a free wheel diode (FWD) is used for various products such as electric vehicles, hybrid vehicles, railways, and electric power equipment. These power semiconductor elements generate heat when operated. Accordingly, it is necessary to suitably cool the power semiconductor elements. Therefore, a water-cooling cooler for circulating water or an air-cooling cooler using a fin is provided, and heat exchange with the cooler is performed, thereby cooling the power semiconductor elements.

Here, a general power conversion device needs multiple semiconductor elements. Furthermore, it is necessary to tightly and densely mount the multiple semiconductor elements on the power conversion device. In order to efficiently cool the multiple semiconductor elements, a structure has been developed which cools a semiconductor component (having the semiconductor element stored therein) from both surfaces. In order to efficiently cool a heat-generating semiconductor element in this way, it is an effective way to alternately arrange the semiconductor component having the incorporated semiconductor element and the cooling device. For example, a technique is known in which the semiconductor component and a cooling tube for cooling are alternately arranged and stacked on each other. For example, this technique is disclosed in JP-A-2011-181687 (PTL 1).

CITATION LIST

Patent Literature

PTL 1: JP-A-2011-181687

SUMMARY OF INVENTION

Technical Problem

The above-described technique in the related art realizes highly efficient cooling for the semiconductor element by alternately arranging the semiconductor component and the cooling device. In order to perform insulation between the semiconductor elements or circuits, the technique adopts a configuration in which a substrate is disposed with a space in an upward direction or in a downward direction of the semiconductor component so as to connect both of these using a terminal. That is, according to the above-described technique in the related art, the insulation is simply ensured by the space. Accordingly, although there is a tendency that the arrangement becomes much denser by alternately arranging the semiconductor component and the cooling device, pressure resistance is not always sufficiently ensured. In addition, if a power conversion device for handling a high-power voltage attempts to ensure the pressure resistance between the semiconductor elements or the circuits inside the device, the space for insulation increases, thereby resulting in an increased size of the device.

An object of the invention is to provide a power-module device, a power conversion device, and a method for manufacturing a power-module device, which are suitable for high pressure while cooling efficiency is maintained.

Solution to Problem

According to the invention, in order to achieve the above-described object, there is provided a power-module device including a case that has multiple recessed portions, and multiple semiconductor components. The case has one side which is a side of the recessed portion, and the other side which is a side opposite to the one side. The case has an edge portion which extends further from the other side toward the one side. The multiple semiconductor components are respectively arranged in the respective recessed portions so as to be interposed between cooling devices via the case from both sides, and have a sealing material arranged on one side of the case. The case has an integral structure so that the sealing material can be held on the one side up to at least a portion of the edge portion.

Alternatively, there is provided a power-module device including a case, and a semiconductor component. The semiconductor component is arranged in a recessed portion of the case so as to be interposed between cooling devices via the case from both sides. The case has a configuration in which a terminal portion forming a portion of the semiconductor component or at least a portion of a terminal to be connected to the semiconductor component can be sealed with a sealing material.

Alternatively, there is provided a method for manufacturing a power-module device which includes arranging a semiconductor component in each of multiple recessed portions of a case molded so that a fluid can be held while being prevented from leaking into at least a portion of an edge portion, arranging cooling devices on the other side so as to interpose the semiconductor component from both sides, and sealing the recessed portion side with a sealing material.

Advantageous Effects of Invention

According to the invention, it is possible to provide a power-module device, a power conversion device, and a method for manufacturing a power-module device, which are suitable for high pressure while cooling efficiency is maintained.

BRIEF DESCRIPTION OF DRAWINGS

FIG. 1 is an external view of a power conversion device according to a first embodiment in the invention.

FIG. 2 is a side view and a sectional view of the power conversion device according to the first embodiment in the invention.

FIG. 4A is an external view and a sectional view of a heat sink which is a component configuring the power conversion device according to the first embodiment in the invention.

FIG. 4B is an external view and a sectional view of the heat sink which is a component configuring the power conversion device according to the first embodiment in the invention and which relates to those which utilize an extruding process.

FIG. 5 is an external view of a pressurizing plate which is a component configuring the power conversion device according to the first embodiment in the invention.

FIG. 6 is a sectional view of a terminal block which is a component configuring the power conversion device according to the first embodiment in the invention.

FIG. 7 is a sectional view of a terminal block support member which is a component configuring the power conversion device according to the first embodiment in the invention.

FIG. 8 is an external view and a sectional view of a case which is a component configuring the power conversion device according to the first embodiment in the invention.

FIG. 9 is a view for describing a method for manufacturing the case which is a component configuring the power conversion device according to the first embodiment in the invention.

FIG. 10 is a first view illustrating a method for manufacturing the power conversion device according to the first embodiment in the invention.

FIG. 13 is a fourth view illustrating the method for manufacturing the power conversion device according to the first embodiment in the invention.

FIG. 14 is a fifth view illustrating the method for manufacturing the power conversion device according to the first embodiment in the invention.

FIG. 15 is a sixth view illustrating the method for manufacturing the power conversion device according to the first embodiment in the invention.

FIG. 16 is a top view of the sixth view illustrating the method for manufacturing the power conversion device according to the first embodiment in the invention.

FIG. 17 is a seventh view illustrating the method for manufacturing the power conversion device according to the first embodiment in the invention.

FIG. 18 is an eighth view illustrating the method for manufacturing the power conversion device according to the first embodiment in the invention.

FIG. 21 is a view for describing a method for manufacturing a case which is a component configuring a power conversion device according to a second embodiment in the invention.

FIG. 22 is a view illustrating the method for manufacturing the power conversion device according to the second embodiment in the invention.

FIGS. 23A-23C are views illustrating a power conversion device according to a third embodiment in the invention.

FIG. 24 is an external view and a sectional view illustrating a power conversion device according to a fourth embodiment in the invention.

FIG. 25 is a view for describing a method for manufacturing a case which is a component configuring the power conversion device according to the fourth embodiment in the invention.

FIG. 26 is a first view illustrating the method for manufacturing the power conversion device according to the fourth embodiment in the invention.

FIG. 27 is a second view illustrating the method for manufacturing the power conversion device according to the fourth embodiment in the invention.

FIG. 28 is an external view of a power conversion device according to a fifth embodiment in the invention.

FIG. 29 is a view illustrating a heat sink configuring the power conversion device according to the fifth embodiment in the invention.

FIG. 30 is a view illustrating the heat sink and a pipe for connecting the heat sink which configure the power conversion device according to the fifth embodiment in the invention.

FIG. 31 is an external view of a power conversion device according to a sixth embodiment in the invention.

FIG. 32 is an external view of a heat pipe configuring the power conversion device according to the sixth embodiment in the invention.

FIG. 33 is an overall circuit of the power conversion device according to the first embodiment in the invention.

DESCRIPTION OF EMBODIMENTS

Figure 3A:
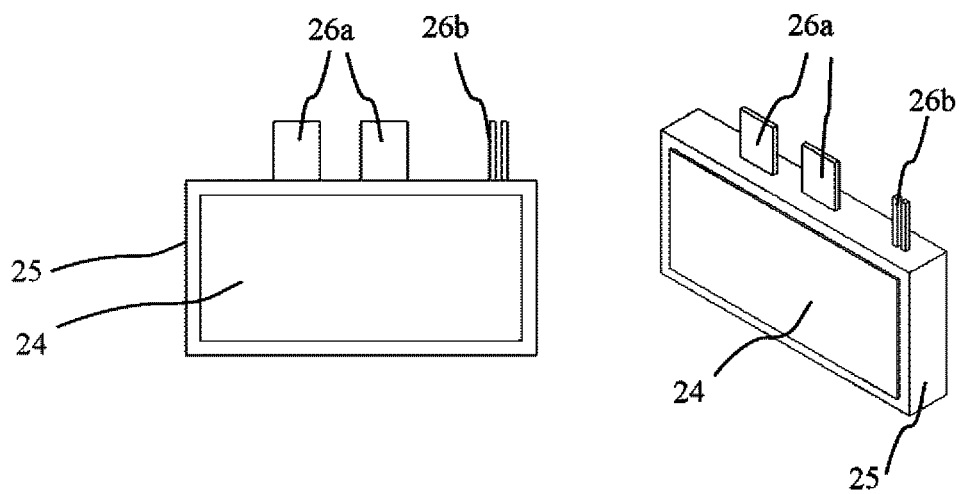
FIGS. 3A and 3B are an external view and a sectional view of a semiconductor component having an incorporated semiconductor element, which is a component configuring the power conversion device according to the first embodiment in the invention.

Hereinafter, embodiments will be described with reference to the drawings.

Embodiment 1

FIG. 33 illustrates a circuit diagram of a power conversion device according to a first embodiment in the invention. As a semiconductor module, a case 1 stores a semiconductor component 27-1, a semiconductor component 27-2, and a semiconductor component 27-3. In this example, the power conversion device is formed from two sets of the case 1, a condenser 101, and a condenser 102.

The semiconductor components 27-1 (upper side) (S1), 27-2 (upper side) (S2), 27-2 (lower side) (S3), and 27-1 (lower side) (S4) are connected in series between DC terminals +E and −E via an external terminal 3-2 of each case 1 (the semiconductor components 27-1, 27-2, and 27-3 are collectively referred to as a semiconductor component 27. Similarly, "-1", "-2", and the like will be given to other components so as to indicate that the components partially form a collectively referred component). Here, the semiconductor components 27-1 and 27-2 are configured to include a parallel circuit of a switching element such as IGBT and a reflux diode (reverse connection). Between the DC terminals +E and −E, the condensers 101 and 102 are connected in series, in parallel with a series circuit of the semiconductor component 27. A neutral terminal N is configured to function as a neutral polarity in a connection point between the condensers 101 and 102. The neutral terminal N and a connection point between the semiconductor components 27-1 (upper side) and 27-2 (upper side) are connected by the semiconductor component 27-3 (upper side) via an external terminal 3-3 disposed in each case 1. Similarly, a connection point between the semiconductor components 27-1 (lower side) and 27-2 (lower side) is connected by the semiconductor component 27-3 (lower side).

The semiconductor component 27-1 is connected to an external terminal 3-1 and an internal terminal 28-2-1 of the semiconductor component 27-2, respectively, via an internal terminal 28-1-1 and an internal terminal 28-1-2. The semiconductor component 27-2 is connected to the internal terminal 28-2-1 of the semiconductor component 27-2 and the external terminal 3-2, respectively, via an internal terminal 28-2-2 and an internal terminal 28-2-2. The semiconductor component 27-3 is connected to a connection point between the internal terminal 28-1-2 of the semiconductor component 27-1 and the internal terminal 28-2-1 of the semiconductor component 27-2, and the external terminal 3-3, respectively, via an internal terminal 28-3-1 and an internal terminal 28-3-2.

The semiconductor component 27-3 is configured to function as a diode. In this configuration, the semiconductor components 27-1 and 27-2 are controlled so as to be turned on/off, thereby selectively outputting any one of a DC voltage +E, a neutral voltage N, and a DC voltage −E between the semiconductor components 27-2 (upper side) and 27-2 (lower side). Alternatively, an alternating current applied between the semiconductor components 27-2 (upper side) and 27-2 (lower side) is output to the DC terminal +E and the DC terminal −E as a direct current. That is, power conversion is performed.

FIG. 1 illustrates an external view of the power conversion device according to the first embodiment in the invention. FIG. 2 illustrates a side view and a sectional view. Four heat sinks 5 are arranged in a lower portion of the case 1, and a terminal block 4 is arranged in an upper portion of the case 1. An external terminal 3 protrudes on a side surface of the terminal block 4. The external terminal 3 enables the power conversion device to be externally and electrically connected so as to function as the power conversion device. A pressurizing plate 6 is arranged on both side surfaces of the heat sink 5. A pressurizing bolt 7 penetrates holes disposed at four locations in the vicinity of corner portions of the pressurizing plate 6, and is connected to a pressurizing nut 8, thereby pressurizing the heat sink 5. In addition, the terminal block 4 is fixed by a terminal block support member 9 which the pressurizing bolt 7 penetrates.

Referring to a sectional view illustrated in FIG. 2, an internal structure of the power conversion device according to the first embodiment in the invention will be described. The case 1 is configured to include a thin metal plate. A cross-sectional shape of the case 1 is a shape in which both side surfaces are higher than the sealing material 2 and three recesses are formed in the central portion. In the present embodiment, the case 1 employs a bending-processed aluminum plate whose thickness is approximately 0.1 mm. The semiconductor components 27 having the incorporated semiconductor element are respectively arranged in the recesses of the case 1. A total of three semiconductor components 27 having the incorporated semiconductor element are provided. Inside each of the semiconductor components 27 having the incorporated semiconductor element, a semiconductor element 21, a metal circuit 22, an insulating material 23, and a heat radiating member 24 are stacked, and all of these members are sealed with a mold resin 25. In addition, a terminal 26 electrically connected to the metal circuit 22 protrudes from the mold resin 25, and is connected to an internal terminal 28 protruding from the terminal block 4. The internal terminal 28 is connected to the external terminal 3 inside the terminal block 4, thereby enabling the semiconductor element 21 to be externally and electrically connected. In the present embodiment, the terminal 26 protruding from the mold resin 25 of the semiconductor component 27 having the incorporated semiconductor element and the internal terminal 28 protruding from the terminal block 4 are firmly joined to each other by means of welding. In addition, the terminal 26 protruding from the mold resin 25 and the internal terminal 28 protruding from the terminal block 4 are sealed with the sealing material 2. In the present embodiment, even in a case where a silicone gel is used as the sealing material 2 or a high pressure-resistant semiconductor element is used, it is possible to ensure sufficient pressure resistance. Four heat sinks 5 are arranged outside the case 1, that is, on a lower side from the case 1 illustrated in a sectional view in FIG. 2, so as to interpose the semiconductor component 27 having the incorporated semiconductor element therebetween via the case 1. The heat sinks are arranged in this way, thereby enabling any semiconductor component 27 having the incorporated semiconductor element to be cooled from both surfaces. The semiconductor component 27 having the incorporated semiconductor element and the heat sinks 5 are pressurized using the pressurizing plate 6. In this manner, it is possible to reduce heat resistance between the semiconductor component 27 having the incorporated semiconductor element and the heat sinks 5.

In the power conversion device according to the first embodiment in the invention, the heat sinks 5 are arranged and pressurized on both surfaces of all of the semiconductor components 27 having the incorporated semiconductor element. Accordingly, it is possible to efficiently cool heat generation inside the semiconductor component 27 having the incorporated semiconductor element. In this case, the semiconductor component 27 having the incorporated semiconductor element and the heat sink 5 face each other via the thin metal case 1. Since there is no intervening member having great heat resistance, it is possible to minimize heat resistance between the semiconductor component 27 having the incorporated semiconductor element and the heat sink 5. Although not illustrated, contact resistance can be further reduced by disposing a low elastic body having high heat conductivity or grease between the semiconductor component 27 having the incorporated semiconductor element and the case 1, and between the case 1 and the heat sink 5. The semiconductor element 21, the semiconductor component 27 having the incorporated semiconductor element, the terminal 26, and the internal terminal 28 are all sealed with the mold resin 25 or the sealing material 2. Even when used for the power conversion device for handling a high voltage, it is possible to ensure sufficient pressure resistance. Furthermore, even in a case where the semiconductor component 27 having the incorporated semiconductor element or the heat sink 5 is thin and a distance is short between the semiconductor component 27 having the incorporated semiconductor element and the terminal 26 which are adjacent to each other, the sufficient pressure resistance can be ensured using a silicone gel. Therefore, a space for the power conversion device can be further miniaturized.

Referring to FIGS. 3 to 8, each member configuring the power conversion device according to the first embodiment in the invention will be described in detail.

FIG. 3a illustrates an external view of the semiconductor component 27 having the incorporated semiconductor element which configures the power conversion device according to the first embodiment in the invention. The semiconductor component 27 having the incorporated semiconductor element which is employed in the present embodiment has a structure in which the heat radiating member 24 is exposed in the central portion on the main surface, terminals 26a and 26b protrude from the upper portion, and all of these are sealed with the mold resin 25.

Figure 3B:
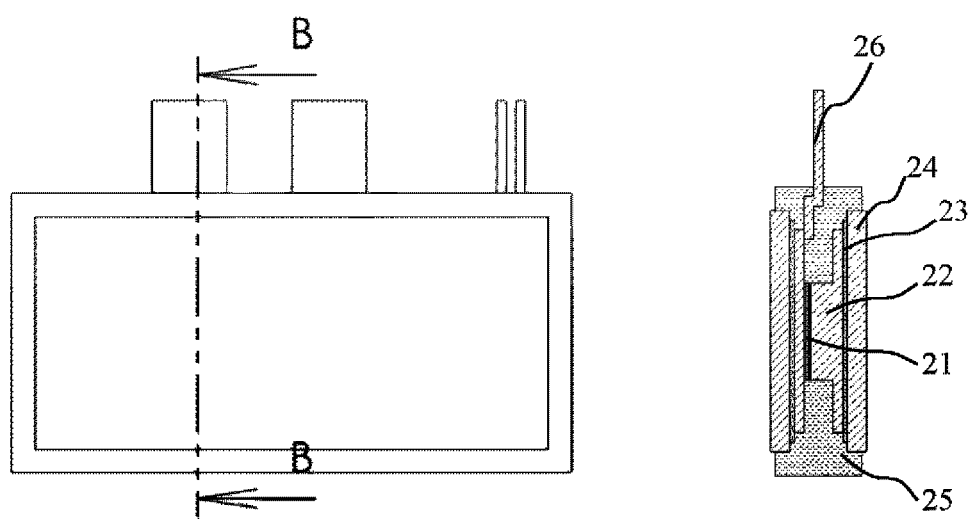

The heat radiating member 24 has a role to transfer heat inside the semiconductor component 27 having the incorporated semiconductor element to the heat sink 5 while being in surface contact with the case 1. The present embodiment employs a very flat copper-made member. Copper has high heat conductivity, and can further minimize heat resistance between the semiconductor component 27 and the heat sink 5. In the terminals 26a and 26b, a cross section of the terminal 26a which allows a large current to flow therein is increased, thereby decreasing current density. In this manner, it is possible to reduce the Joule heat generated when power is supplied. On the other hand, a cross section of the controlling terminal 26b which does not allow the large current to flow therein is decreased, thereby enabling the conductor component 27 to be miniaturized. FIG. 3b illustrates a sectional view of the semiconductor component 27 having the incorporated semiconductor element which configures the power conversion device according to the first embodiment in the invention. The semiconductor component 27 has at least one or more semiconductor elements 1. The metal circuit 22 is arranged on both surfaces of the semiconductor element 1, and a portion of the semiconductor component 27 serves as the terminal 26. In the present embodiment, the semiconductor element 1 and the metal circuit 22 are joined to each other by means of soldering. At least one side in the metal circuits 22 arranged on both surfaces of the semiconductor element 1 is configured so that the thickness of the portion in contact with the semiconductor element 1 is greater than the thickness of other portions. In this manner, it is possible to ensure an inter-circuit distance of the metal circuits 22 arranged on both surfaces of the semiconductor element 1. Accordingly, even in a case where a high voltage is handled, reliability can be sufficiently ensured. In the metal circuit 22, the insulating materials 23 are respectively arranged on surfaces opposite to a side facing the semiconductor element 21. The semiconductor element 21 and the metal circuit 22 are insulated from the case 1, thereby ensuring circuit reliability. The thickness of the insulating material 23 can be selected depending on a voltage to be used. In the present embodiment, the insulating material 23 employs silicon nitride whose thickness is approximately 0.64 mm. Depending on required pressure resistance or heat resistance, it is also possible to employ other ceramic materials or a resin sheet having an insulating property. As heat conductivity of the employed insulating material increases and the thickness is thinner, heat resistance can be minimized. In the insulating material 23, the heat radiating member 24 is arranged on a surface opposite to a side facing the metal circuit 22. In the present embodiment, only copper, silicon nitride, and solder are arranged between the semiconductor element 21 and the heat radiating member 24. Since all of these are thin members having high heat conductivity, it is possible to minimize the heat resistance between the semiconductor element 21 and the heat radiating member 24. In the present embodiment, the metal circuit 22 or the heat radiating member 24 employs copper, but it is also possible to employ aluminum or other metal materials. In a case of employing aluminum, the heat conductivity is lower than that of copper. Accordingly, whereas the heat resistance increases, there is a characteristic that the members are light in weight and are likely to be processed. The materials can be suitably used depending on use. The semiconductor element 21, the metal circuit 22, the insulating material 23, the heat radiating member 24, and the terminal 26 are sealed with the mold resin 25 except for a portion of the heat radiating member and the terminal 26. All of these are sealed with the mold resin 25, thereby preventing an electrical short circuit and ensuring pressure resistance. A thermal deformation difference between respective members which occurs during operation can be reduced, and strength reliability can be ensured.

FIG. 4(a) illustrates an external view and a sectional view of the heat sink 5 configuring the power conversion device according to the first embodiment in the invention. The heat sink 5 has a role to cool the semiconductor member 27 while two surfaces serving as the main surface are in contact with the case. A fin is disposed in a direction substantially orthogonal to the main surface inside the heat sink 5, thereby forming a water passage 41. Connecting members 42 and 44 are respectively disposed on the two surfaces serving as the main surface of the heat sink 5. An O-ring groove 43 is disposed in the connecting member 42 out of the connecting members 42 and 44. An O-ring is arranged in this groove, and the groove is connected to the connecting member 44 of the other heat sink 5. In this manner, the water passage can be configured. An outer diameter of the connecting member 42 and an inner diameter of the connecting member 44 are set so that water leakage can be prevented by the O-ring suitably crushed when the connecting members 42 and 44 are connected to each other. In the present embodiment, the O-ring is set to be crushed as much as approximately 20% when connected. In the present embodiment, copper is employed as a material of the heat sink. Since copper having high heat conductivity is employed, heat resistance can be reduced. Depending on a type of cooling medium or required heat radiating performance, a different material such as aluminum can also be employed. In a case of employing aluminum, the heat conductivity is lower than that of copper. Accordingly, whereas the heat resistance increases, there is a characteristic that the heat sink is light in weight and is likely to be processed. The materials can be selectively used depending on use.

In FIG. 4(a), multiple members are combined with each other so as to configure the fin. However, as illustrated in FIG. 4(b), a member subjected to extruding process can be employed so that the fin is configured to include a single member. Through the extruding process, an extruding member 46 internally having a water passage and a heat sink terminal member 47 integrated with the connecting member 42 or 43 are joined to each other. In this manner, a single heat sink 5 can be configured. In this case, the extruding member 46 and the heat sink terminal member 47 can be joined to each other by means of brazing or bonding. In this heat sink structure, since the fin is configured to include a single member, it is possible to provide the fin which is inexpensive and excellently reliable. On the other hand, a shape of the fin is limited due to workability of the extruding process. Accordingly, in a case where the more detailed shape of the fin is required, it is an effective way to employ a structure in which the fin is configured to include multiple members combined with each other as illustrated in FIG. 4(a).

FIG. 5 illustrates an external view of the pressurizing plate 6 configuring the power conversion device according to the first embodiment in the invention. In the present embodiment, the pressurizing plate 6 employs a stainless steel-made plate whose thickness is approximately 5 mm. A through-hole 51 for the pressurizing bolt 7 is disposed in the vicinity of corner portions of the pressurizing plate 6. In addition, a hole 52 for the connecting member of the heat sink 5 is also disposed therein. As illustrated, the pressurizing plate 6 is bent in a longitudinal direction and in an out-of-plane direction. A bending effect will be described later.

FIG. 6 illustrates an external view of the terminal block 4 configuring the power conversion device according to the first embodiment in the invention. In the present embodiment, the terminal block 4 is configured to include an epoxy resin. The copper-made external terminal 3 protrudes outside the terminal block 4, and the copper-made internal terminal 28 protrudes inside the terminal block 4. The external terminal 3 and the internal terminal 28 are coupled to each other inside the terminal block 4. Although not illustrated, a lower surface of the terminal block 4 has a recessed portion for positioning the terminal block 4 by forming a pair with a terminal block positioning projection 72 disposed on an upper surface of the terminal block support member 9.

FIG. 7 illustrates an external view of the terminal block support member 9 configuring the power conversion device according to the first embodiment in the invention. A through-hole 71 for the pressurizing bolt 7 is disposed on a side surface of the terminal block support member 9, and the terminal block positioning projection 72 is disposed on the upper surface of the terminal block support member 9. The thickness of the terminal block support member 9 is smaller than the thickness of the semiconductor component 27 having the incorporated semiconductor element. In the present embodiment, an epoxy resin is employed for a material of the terminal block support member 9. As long as the terminal block support member 9 can ensure rigidity required for positioning of the terminal block, other materials can also be employed.

FIG. 8 illustrates an external view and a sectional view of the case 1 configuring the power conversion device according to the first embodiment in the invention. In the present embodiment, the case 1 is configured so that an aluminum plate whose thickness is 0.1 mm is subjected to bending process. Three recesses for inserting the semiconductor component 27 having the incorporated semiconductor element are disposed in the case 1, and the bending process is performed so that end portions are arranged on substantially the same plane. Accordingly, even if a liquid silicone gel is injected, the gel does not leak from the case 1, and the case 1 can be sealed with the silicone gel. Furthermore, a portion serving as a heat radiating path while facing the semiconductor component 27 having the incorporated semiconductor element or the heat sink 5 is planar, and has an effective shape in reducing heat resistance. In addition, the case 1 has a shape similar to a spring, and has extremely low rigidity in a direction perpendicular to the surface serving as the heat radiating path while facing the semiconductor component 27 or the heat sink 5, that is, in a direction where a component is pressurized in order to reduce contact heat resistance after the component is mounted. Therefore, when pressurized, the rigidity of the case 1 does not hinder the pressurizing. In the present embodiment, aluminum is employed for the material of the case 1, but it is also possible to employ other materials such as copper, or an alloy of aluminum and copper. In a case of employing copper for the case 1, heat conductivity is higher than that of aluminum. Accordingly, heat resistance can be further minimized. On the other hand, the rigidity becomes stronger than that of aluminum. In view of these characteristics, the material can be selected.

Referring to FIGS. 9 to 18, a method for manufacturing the power conversion device according to the first embodiment in the invention will be described.

First, referring to FIG. 9, a method for manufacturing the case 1 will be described. The case 1 is manufactured by performing a bending process on a substantially rectangular thin plate 71. The case 1 can be formed by performing valley bending on a dotted line portion illustrated in the drawing and performing mountain bending on a dotted chain line portion. In the present embodiment, an aluminum plate whose thickness is 0.1 mm is employed for the material of the case 1. Aluminum which is excellent in workability is employed so as to enable the bending process while breakage during the process is prevented. Accordingly, the completely manufactured case 1 has no hole from which the silicone gel leaks or no broken portion. In the thin plate 91, dimensions L1 to L7 after the bending process respectively represent as follows. L1 represents the width of the recess at the mounting position of the semiconductor component 27. L2 represents the depth of the recess at the mounting position of the semiconductor component 27. L3 represents the width at the installing position of the heat sink 5. L4 represents the width of an end portion of the case 1 at the installing position of the heat sink 5. L5 represents the height of an edge of the case 1. L6 represents the length of the recess at the mounting position of the semiconductor component 27. L7 represents the dimension of the case 1 in the longitudinal direction when the semiconductor component 27 is mounted. The dimension or bending portion of the thin plate 91 is determined depending on the dimension or the number of the semiconductor components 27 to be mounted or the heat sinks. In this manner, the case corresponding to any number of components or any component dimension can be manufactured.

Next, as illustrated in FIG. 10, four heat sinks 5 are connected so as to configure a water passage. In this case, the water passage is configured by preparing two types of a heat sink 5a and a heat sink 5b in which the positions of the connecting members 42 and 44 are laterally symmetrical to each other, and respectively and sequentially connecting the these sinks to each other. In this case, the O-ring is disposed in the O-ring groove 43 of the connecting member 42, and a coolant can be prevented from leaking in the connection portion. In addition, the dimension of the connection portion can be freely changed in the pressurizing direction, that is, in the connected direction. Accordingly, the rigidity of the connection portion does not hinder the pressurizing when pressurized.

Figure 11A:
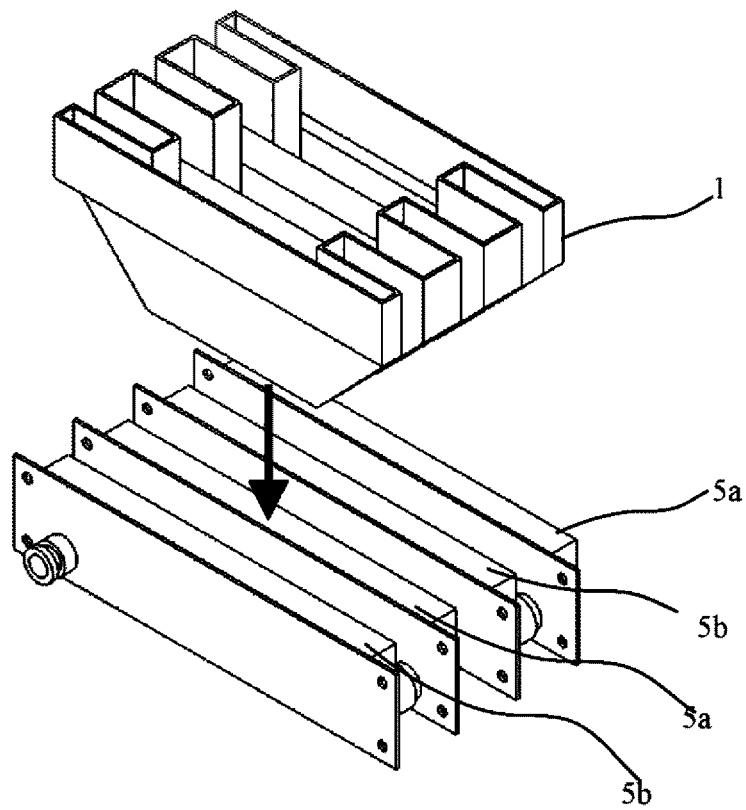
FIGS. 11A and 11B are second views illustrating the method for manufacturing the power conversion device according to the first embodiment in the invention.
Figure 11B:
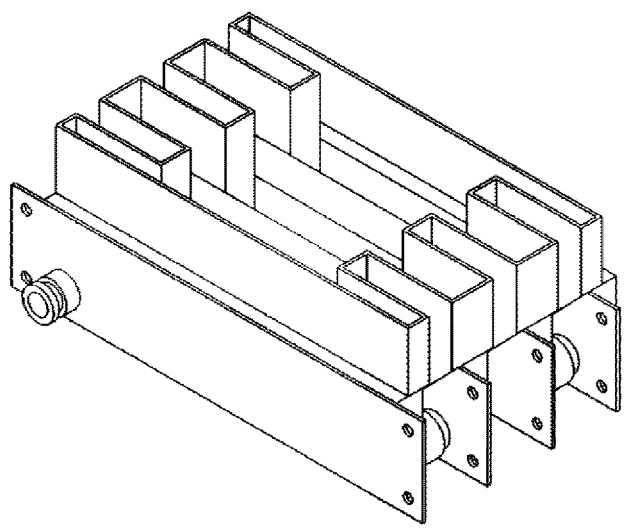

Next, as illustrated in FIG. 11, the case 1 is installed among the four connected heat sinks 5. In this manner, the heat sinks 5 are arranged on both sides of the recessed portion of the case 1.

Figure 12A:
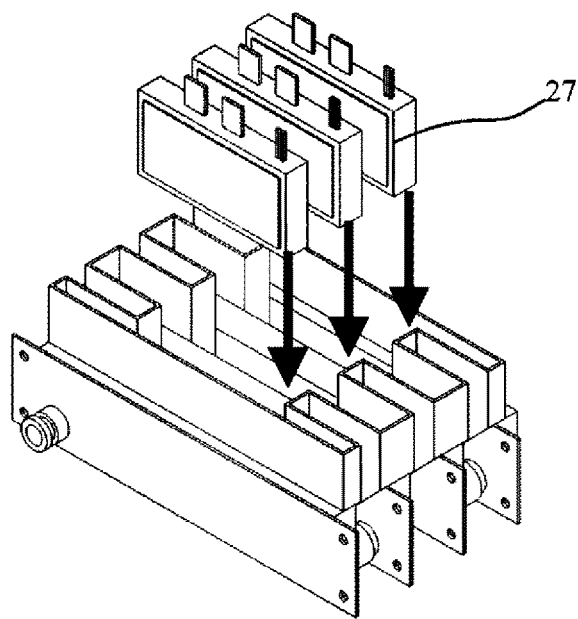
FIGS. 12A and 12B are third views illustrating the method for manufacturing the power conversion device according to the first embodiment in the invention.
Figure 12B:
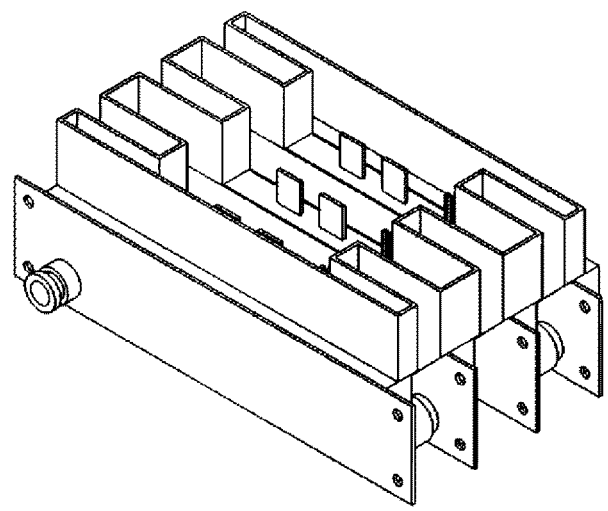

Next, as illustrated in FIG. 12a, the semiconductor components 27 having the incorporated semiconductor element are respectively installed in the three recesses of the case 1. In this case, a surface which serves as the main surface of the semiconductor component 27 and from which the heat radiating member 24 is exposed comes into contact with a surface of the case 1 which faces the main surface of the heat sink 5. In this manner, the heat sinks 5 can be respectively arranged on both surfaces of the semiconductor component 27. In the present embodiment, after the case 1 is installed in the upper portion of the heat sink 5, the semiconductor component 27 is installed in the recess of the case 1. However, after the semiconductor component 27 is installed in the recess of the case 1, the case 1 may be installed in the upper portion of the heat sink 5.

Next, as illustrated in FIG. 13, a total of six terminal block support members 9 are arranged in a side portion of the semiconductor component 27 having the incorporated semiconductor element. In this case, the terminal block positioning projection 72 on the upper surface of the terminal block support member 9 is located at a position which is higher than that of the edge of the case 1.

Next, as illustrated in FIG. 14, two pressurizing plates 6 are arranged on both side surfaces of the heat sink 5. In this case, the pressurizing plates 6 are arranged so as to face the heat sink 5 in a direction where the pressurizing plate 6 is bent to project. The hole 52 for the connecting member is disposed in the pressurizing plate 6. Accordingly, there is no possibility that the connecting members 42 and 44 of the heat sink 5 may come into contact with the pressurizing plate 6.

Next, as illustrated in FIG. 15, the pressurizing bolt 7 is caused to penetrate the through-hole 51 for the pressurizing bolt disposed in the pressurizing plate 6, a through-hole 45 for the pressurizing bolt disposed in a water passage module 5, and the through-hole 71 for the pressurizing bolt disposed in the terminal block support member 9, and is coupled to the pressurizing nut 8, thereby pressurizing the entire body. Each position of the pressurizing plate 6, the water passage module 5, and the terminal block support member 9 is fixed by the pressurizing bolt 7 which penetrates and pressurizes all of these. In this case, as in a top view illustrated in FIG. 16, the width in the pressurizing direction of the terminal block support member 9 is smaller than the width of the semiconductor component 27. Accordingly, a pressurizing force generated by an axial force of the pressurizing bolt 7 is not applied to the terminal block support member 9, and the surface of the semiconductor component 27 receives the pressurizing force. Therefore, the semiconductor component 27 can be suitably pressurized by the pressurizing force.

Next, as illustrated in FIG. 17, the terminal block 4 is arranged in the upper portion of the case 1. The terminal 26 of the semiconductor component 27 and the internal terminal 28 of the terminal block are joined to each other by means of welding. In this case, a recessed portion located on the lower surface of the terminal block 4 and a projection portion located on the upper surface of the terminal block support member 9 are bonded to each other using an adhesive, thereby enabling the terminal block to be positioned.

Next, as illustrated in FIG. 18, a liquid silicone gel prior to curing is injected as the sealing material 2 to a position on which the semiconductor component 27 is mounted inside the case 1. The liquid silicone gel is injected so that a liquid surface thereof is located higher than the terminal 26 of the conductor component 27 or the internal terminal 28 of the terminal block. In this manner, the semiconductor component 27, the terminal 26 of the conductor component 27, and the internal terminal 28 of the terminal block can be sealed. In this case, the case 1 is subjected to bending process so that end portions of one sheet of aluminum plate are arranged on substantially the same plane. Accordingly, if the liquid surface is located lower than the plane of the end portions, the liquid silicone gel does not leak. After the silicone gel is injected, the gel is cured, thereby completing the sealing and completely manufacturing the power conversion device.

Referring to FIGS. 1 to 18, in the power conversion device according to the first embodiment in the invention in which the structure and the manufacturing method have been described, the heat sinks 5 are arranged and pressurized on both sides of all of the semiconductor components 27 having the semiconductor element. In this manner, it is possible to efficiently cool the semiconductor element 21 from both surfaces. In addition, the rigidity of the case 1 or the water passage is weak in the pressurizing direction. Accordingly, in a case where heat resistance is reduced by pressurizing, the rigidity of the case 1 does not interfere with the pressurizing. The width of the terminal block support member 9 is narrower than the width of the semiconductor component 27. Accordingly, it is possible to prevent the terminal block support member 9 from interfering with the pressurizing. Furthermore, through the bending process of the thin plate, a case shape is realized in which all sides configuring the outer shape of the thin plate are arranged on substantially the same plane. The semiconductor component 27 having the incorporated conductor device is arranged at the position serving as the recess. In this manner, the semiconductor component 27 having the incorporated semiconductor element 21 can be suitably sealed while the liquid silicone gel does not leak even if the silicone gel is injected for silicone gel sealing. For this reason, it is possible to provide the power conversion device which is excellent in cooling capacity or pressure resistance.

Figure 19A:
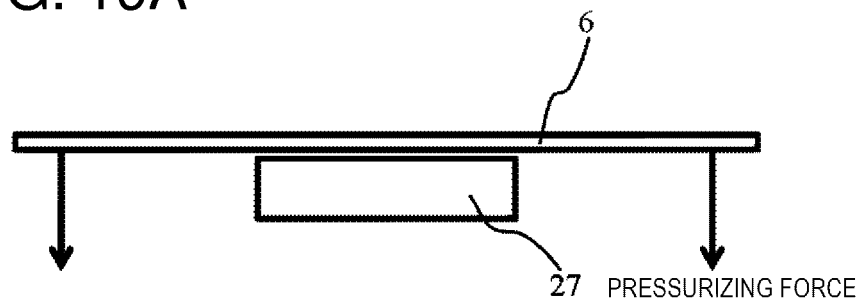
FIGS. 19A and 19B are first views illustrating a bending effect of the pressurizing plate which configure the power conversion device according to the first embodiment in the invention.
Figure 19B:
Figure 20A:
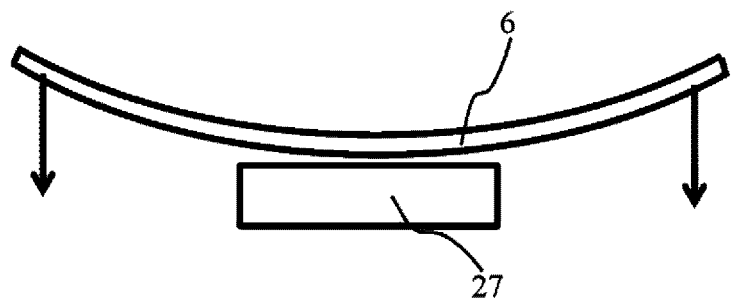
FIGS. 20A and 20B are second views illustrating a bending effect of the pressurizing plate which configures the power conversion device according to the first embodiment in the invention.
Figure 20B:
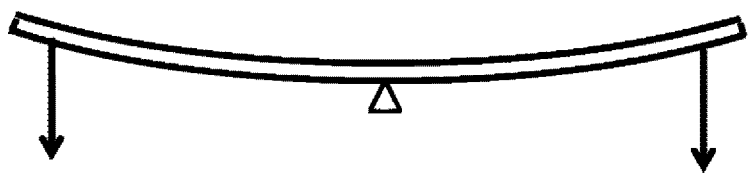

As described above, the pressurizing plate 6 is bent in advance. This advantageous effect will be described with reference to FIG. 19. FIG. 19 illustrates deformation in a case where the semiconductor component 27 is pressurized in the pressurizing plate 6 which is not bent. The pressurizing force is generated at a position of the pressurizing bolt 7, that is, in the vicinity of a corner portion of the pressurizing plate 6. The dimension of the semiconductor component 27 is smaller than the distance where the pressurizing force is generated. Accordingly, in a case where the pressurizing plate 19 is not bent, as illustrated in FIG. 19b, 4-point bending deformation occurs from an end portion of the semiconductor component 27 which serves as a fulcrum. As a result, surface pressure in the vicinity of the central portion of the semiconductor component 27 decreases. On the other hand, in a case where the pressurizing plate 6 is bent as illustrated in FIG. 20, 3-point bending deformation occurs from the central portion of the semiconductor component 27 which serves as a fulcrum. As a result, surface pressure in the vicinity of the central portion of the semiconductor component 27 increases. If a suitable bending amount is provided, the semiconductor component 27 can be intermediately deformed between the 4-point bending deformation mode illustrated in FIG. 19 and the 3-point bending deformation mode illustrated in FIG. 20. Accordingly, the semiconductor component 27 can be suitably pressurized at any position of the central portion and the end portion of the semiconductor component 27. If the pressurizing plate 6 is excessively bent, the surface pressure in the vicinity of the central portion of the semiconductor component 27 increases. In contrast, the surface pressure in the vicinity of the end portion of the semiconductor component 27 decreases. Therefore, it is desirable to provide the suitable bending amount.

FIGS. 19 and 20 illustrate only the pressurizing plate and the semiconductor component 27. However, in practice, the heat sink 5 is arranged therebetween. Therefore, the pressurizing force applied to the vicinity of the corner portion of the pressurizing plate 6 is averaged by the heat sink 5. Accordingly, the surface pressure applied to the semiconductor component 27 can be further equalized. In this case, if bending rigidity of the pressurizing plate 6 is smaller than bending rigidity of the heat sink 5, an advantageous effect having the bent pressurizing plate 6 is reduced. Therefore, it is desirable to set the material and the plate thickness of the pressurizing plate 6 so that the bending rigidity of the pressurizing plate 6 is greater than the bending rigidity of the heat sink 5.

Embodiment 2

FIG. 21 illustrates a case 211 configuring a power conversion device and a development plan 212 thereof according to a second embodiment in the invention. A point different from that in the case 1 employed in Embodiment 1 is as follows. Whereas the case 1 employed in Embodiment 1 has three recesses for arranging the semiconductor component 27 having the incorporated semiconductor element, the case 211 employed according to the present embodiment has two recesses. Therefore, compared to the development plan of the case 1 illustrated in FIG. 9, according to the development plan 212 of the case 211, the longitudinal dimension of the aluminum plate prior to the bending process is shorter, and fewer bending portions are provided. In this way, in the case used for the power conversion device according to the invention, the dimension or the bending portion of the aluminum plate to be used is selected. In this manner, the case can employ a shape corresponding to the number or the dimension of the semiconductor components 27 to be installed. This point is a major characteristic according to the invention.

Referring to FIG. 22, a method for manufacturing the power conversion device according to the second embodiment in the invention will be described. Three heat sinks 5 are arrayed side by side, and the case 212 is installed therebetween. In this case, similarly to Embodiment 1, the respective heat sinks 5 are connected to each other at connection portions 42 and 44 by using an O-ring. Accordingly, the length of the connection portion can be freely changed in the connection direction. Next, the semiconductor components 27 having the incorporated semiconductor element are respectively installed in two recesses of the case 211. In this case, the heat sink 5 is arranged so that a surface which serves as the main surface of the semiconductor component 27 and from which the heat radiating member 24 is exposed comes into contact with a surface of the case 211 which faces the main surface of the heat sink 5. In this manner, the heat sink 5 can be arranged on both surfaces of the semiconductor component 27. The subsequent manufacturing method is the same as that according to Embodiment 1.

According to Embodiment 1, the power conversion device internally includes three semiconductor components 27. In contrast, according to the present embodiment, the power conversion device internally includes two semiconductor components 27. Conditions of a voltage or a current used for the power conversion device are different from those according to Embodiment 1. In this way, in the power conversion device according to the invention, the same semiconductor components 27 and heat sinks 5 are prepared, and the number of members to be used is freely changed. In this manner, it is possible to configure the power conversion device which is suitable for an intended use. Therefore, a wide lineup corresponding to various intended uses can be constructed using the same semiconductor components 27.

Embodiment 3

FIG. 23 is a view for describing a power conversion device according to a third embodiment in the invention. A different point between the present embodiment and the first embodiment is as follows. As illustrated in FIG. 23a, three semiconductor components 27 are mounted on the case 1. As illustrated in FIG. 23b, a terminal block (not illustrated) is installed and sealed with a silicone gel (contour is illustrated), and the gel is cured. Thereafter, as illustrated in FIG. 23c, a region of a trapezoidal shape in both longitudinal end portions of the case is cut off. The region of the trapezoidal shape in both longitudinal end portions of the case has a role to prevent leakage in a case where a liquid silicone gel is injected. However, after the silicone gel is cured, the leakage does not occur even if the region is cut off. Since the region is cut off, the case when in use can be miniaturized, and the heat sink can also be miniaturized. Accordingly, the overall power conversion device can be miniaturized. On the other hand, it becomes necessary to perform a process for cutting the case and the cured silicone gel. Therefore, depending on the purpose of miniaturization and process shortening, Embodiment 3 can be adopted separately from Embodiment 1.

Embodiment 4

FIG. 24 illustrates an external view and a sectional view of a power conversion device according to a fourth embodiment in the invention. The external view is the same as that according to Embodiment 1. A point different from that according to Embodiment 1 is as follows. In the sectional view, the semiconductor component 27 having the incorporated semiconductor element has no mold resin 25, and the entire sealing is performed using only the sealing material 2 which is the silicone gel. In the present embodiment, when the semiconductor component 27 having the incorporated semiconductor element is manufactured, resin molding is not required. Accordingly, the manufacturing process can be simplified. In addition, as much as the mold resin is omitted, the outer dimension of the semiconductor component 27 can be minimized. Therefore, the overall power conversion device is effectively miniaturized. In the present embodiment, the outer dimension of the insulating material 23 can become larger than that of the metal circuit 22. In this manner, even if the mold resin 25 is not provided, when the semiconductor component 27 is installed in the case 1, the case 1 and the metal circuit 22 do not come into contact with each other, and electrical short circuit can be prevented. Furthermore, after the silicone gel is injected, pressure resistance can be sufficiently ensured. However, the semiconductor element 21 or the metal circuit 22 is not sealed with the mold resin 25. Accordingly, it is necessary to pay attention to reducing thermal stress caused by a thermal deformation difference of each member due to temperature rising during operation. As a method for reducing the thermal deformation difference of each member, it is an effective way to use molybdenum or tungsten which is a material whose linear expansion coefficient is less different from that of the semiconductor element 21, for at least a portion of the metal circuit 22. In addition, in order to reduce the thermal stress, it is also an effective way to use carbon or a composite material containing carbon for a portion of the metal circuit 22.

Referring to FIGS. 25 to 27, a method for manufacturing a power conversion device according to a fourth embodiment in the invention will be described. The method for manufacturing the case 1 illustrated in FIG. 25 is the same as that according to Embodiment 1. However, since the outer dimension of the semiconductor component 27 becomes smaller, the case 1 can be miniaturized. Next, as illustrated in FIG. 26, the case 1 is installed in the heat sink 5. Since the outer dimension of the semiconductor component 27 becomes smaller, the heat sink 5 can also be miniaturized. Next, as illustrated in FIG. 27, a semiconductor component 241 which is not molded is installed in the case 1. In this case, the semiconductor component 241 is not molded, and the metal circuit 22 or the semiconductor element 21 is exposed. Accordingly, it is necessary to pay attention to handling. Next, as illustrated in FIG. 28, pressurizing is performed using the pressurizing plate 6, the pressurizing bolt 7, and the pressurizing nut 8. The terminal block 4 is installed in the upper portion of the case 1, and the terminals 26 and 28 are connected to each other. Next, a liquid silicone gel is injected into the case 1, and the gel is cured. In this manner, all of the semiconductor element 21, the metal circuit 22, and the terminal 26 can be sealed, thereby completely manufacturing the power conversion device.

Embodiment 5

FIG. 28 illustrates an external view of a power conversion device according to a fifth embodiment in the invention. A point different from that according to the first embodiment is that multiple heat sinks 281 are connected using a low elastic pipe 282 instead of the O-ring. In a case of connection using the low elastic pipe 282, the length of the connection portion cannot be freely changed, unlike a case where the heat sinks are connected to each other using the O-ring as in Embodiment 1. However, the low elastic pipe 282 is subjected to bending deformation against a load applied in the pressurizing direction. Accordingly, a material or a dimension of the pipe 282 is suitably selected, rigidity in the pressurizing direction can be minimized. As a result, a distance in the pressurizing direction between the adjacent heat sinks can be freely changed. Therefore, pressurizing of the semiconductor component 27 is not hindered.

FIG. 29 illustrates an external view and a sectional view of the heat sink 281 employed in the present embodiment. A pipe insertion port 291 is disposed in both end portions of the heat sink 281. In addition, a cooling fin is disposed therein, thereby enabling efficient cooling.

FIG. 30 illustrates a connection state between the heat sink 281 and the pipe 282 which are employed in the present embodiment. The pipe insertion ports 291 of the adjacent heat sinks 281 are connected by the pipe 282, thereby configuring a single water passage. In the present embodiment, shapes of the adjacent heat sinks 281 may be the same as each other. Therefore, it is not necessary to prepare two types of laterally symmetrical shape as illustrated in Embodiment 1. One type of the heat sink 281 may be prepared. The present embodiment employs the heat sink 281 having the pipe insertion port 291 one by one in both end portions, and the water passages are arranged in series. In a case where a coolant is caused to flow in parallel in the multiple heat sinks 281, the heat sink 281 having the pipe insertion port 291 two by two in both end portions may be used. Depending on a cooling method or the amount of the coolant, the types can be selectively used. In addition, in the present embodiment, the pipe 282 is disposed outside the pressurizing bolt 7, but can also be disposed inside the pressurizing bolt 7. In this case, since the outer dimension of the power conversion device can be minimized, the power conversion device is effectively miniaturized. On the other hand, it is necessary to shorten the length of the heat sink 281, and a pipe diameter which can be used is less freely selected since a space for guiding the pipe 282 is regulated. In view of these facts, a pipe position can be selected.

Embodiment 6

FIG. 31 illustrates an external view of a power conversion device according to a sixth embodiment in the invention. A point different from that according to the first embodiment is that cooling is performed using a heat pipe 311 instead of the water cooling heat sink 5. FIG. 32 illustrates the heat pipe 311 employed in the present embodiment. A pipe portion 322 internally having a liquid protrudes from a contact portion 321 between the heat pipe and the case, and a cooling fin 323 is connected to the protruding portion. In the power conversion device illustrated in FIG. 31, four heat pipes 311 and the contact portion 321 between the heat pipe and the case are arranged on both sides of the semiconductor component 27 via the case 1, and cool the semiconductor component 27 from the both surfaces. In the drawing, the heat pipe 311 is arranged below the power conversion device, but the heat pipe is arranged above the power conversion device during operation. As a result, the liquid inside the pipe portion 322 is arranged in the vicinity of the semiconductor component 27, and is vaporized due to heat generation of the semiconductor component 27. The vapor moves to the vicinity of the cooling fin 323, and is cooled and liquefied. The liquid moves again to the vicinity of the semiconductor component 27. This cycle is repeated, thereby cooling the semiconductor component 27. In the present embodiment, the four heat pipes 311 are employed, but these pipes 311 may be connected at a position of the cooling fin 323. In this case, whereas handling such as mounting work is facilitated, rigidity inevitably increases. Therefore, it is necessary to pay attention to a shape of the cooling fin 323 so as not to hinder pressurizing.

In the present embodiment, the heat pipe 311 is arranged below the power conversion device, but the heat pipe 311 can also be arranged beside the power conversion device. In the power conversion device according to the invention, a space is present on a side surface of the contact portion 321 between the heat pipe and the case. Accordingly, the pipe portion 322 of the heat pipe 311 is caused to pass through the side surface, that is, between the two pressurizing bolts 7. In this manner, the heat pipe 311 can be arranged beside the power conversion device.

In the power conversion device according to the invention, the semiconductor component, wires, and a cooling portion are separated from each other by the case 1. Accordingly, a major characteristic is that the present embodiment employs a different cooling method without changing the semiconductor component or the wires. The present embodiment employs a cooling method using the heat pipe. However, depending on required cooling capacity, the present embodiment can also employ other cooling methods such as an air cooling method. Even in a case where any cooling method is employed, the semiconductor component 27 can be cooled from both surfaces.

Embodiment 7

As described with reference to the above embodiments, an object can be achieved as follows. A substantially rectangular thin plate is subjected to mountain bending and valley bending so as to form a shape having as many recesses as the number of the mounted semiconductor components having the incorporated semiconductor element. Concurrently, a lateral side in the direction orthogonal to the above-described bending direction is bent so as to dispose the case in which all edges configuring an outer shape of the thin plate are arranged on substantially the same plane. The semiconductor component having the incorporated semiconductor element is arranged at a position serving as the recess of the case. The cooling devices are arranged so as to interpose the semiconductor component having the incorporated semiconductor element via the case. The semiconductor component having the incorporated semiconductor element is sealed with a silicone gel. In addition, preferably, the case is configured to include metal which has high heat conductivity. More preferably, the case is configured to include aluminum, copper, or an alloy whose principal components are both of these.

In the cooling device, multiple independent cooling modules are arranged on both sides of the semiconductor component having the incorporated semiconductor element, and the respective cooling modules are connected at a low rigid connection portion in the pressurizing direction. Furthermore, the terminal block support member is arranged in a side portion of the semiconductor component having the incorporated semiconductor element so as to support the terminal block. In this case, the thickness of the terminal block support member is set to be smaller than the thickness of the semiconductor component having the incorporated semiconductor element.

According to this configuration, the semiconductor component having the incorporated semiconductor element and the cooling device can be alternately arranged. Accordingly, the semiconductor element can be efficiently cooled from both surfaces. In addition, the rigidity of the case decreases in the direction where the semiconductor component having the incorporated semiconductor element and the cooling device are alternately arranged. Accordingly, in a case where heat resistance is reduced by the pressurizing a portion between the semiconductor component having the incorporated semiconductor element and the cooling device, the rigidity of the case does not interfere with the pressurizing. Furthermore, through the bending process of the thin plate, a case shape is realized in which all of the edges are arranged on substantially the same plane. The semiconductor component having the incorporated conductor device is arranged at the position serving as the recess. Accordingly, the semiconductor component having the incorporated semiconductor element can be suitably sealed while the sealing material such as the liquid silicone gel does not leak even if the silicone gel is injected. For this reason, it is possible to provide the power conversion device which is excellent in cooling capacity or pressure resistance. Furthermore, it is possible to prevent the cooling device or the terminal block support member from hindering the pressurizing of the semiconductor component having the incorporated semiconductor element and the cooling device. Therefore, suitable pressurizing can be realized.

Hitherto, the invention has been described in detail with reference to the embodiments. However, as a matter of course, the invention is not limited to the above-described embodiments, and can be modified in various ways within the scope not departing from the gist of the invention.

REFERENCE SIGNS LIST

1 CASE
2 SEALING MATERIAL
3 EXTERNAL TERMINAL
4 TERMINAL BLOCK
5 HEAT SINK
6 PRESSURIZING PLATE
7 PRESSURIZING BOLT
8 PRESSURIZING NUT
9 TERMINAL BLOCK SUPPORT MEMBER
21 SEMICONDUCTOR ELEMENT
22 METAL CIRCUIT
23 INSULATING MATERIAL
24 HEAT RADIATING MEMBER
25 MOLD RESIN
26, 26a, 26b TERMINAL OF SEMICONDUCTOR COMPONENT HAVING INCORPORATED SEMICONDUCTOR ELEMENT
27 SEMICONDUCTOR COMPONENT HAVING INCORPORATED SEMICONDUCTOR ELEMENT
28 INTERNAL TERMINAL
41 WATER PASSAGE
42 CONNECTING MEMBER
43 O-RING GROOVE
44 CONNECTING MEMBER
45 POSITIONING HOLE
46 EXTRUDING FIN MEMBER
47 HEAT SINK TERMINAL MEMBER
51 THROUGH-HOLE FOR PRESSURIZING BOLT 7
52 HOLE FOR CONNECTING MEMBER OF HEAT SINK 5
71 THROUGH-HOLE FOR PRESSURIZING BOLT 7
72 TERMINAL BLOCK POSITIONING PROJECTION
91 THIN PLATE PRIOR TO CASE BENDING PROCESS
L1 BENDING DIMENSION OF THIN PLATE
L2 BENDING DIMENSION OF THIN PLATE
L3 BENDING DIMENSION OF THIN PLATE
L4 BENDING DIMENSION OF THIN PLATE
L5 BENDING DIMENSION OF THIN PLATE
L6 BENDING DIMENSION OF THIN PLATE
L7 BENDING DIMENSION OF THIN PLATE
211 CASE IN EMBODIMENT 2
212 CASE DEVELOPMENT PLAN IN EMBODIMENT 2
241 SEMICONDUCTOR COMPONENT HAVING INCORPORATED SEMICONDUCTOR ELEMENT WHICH IS NOT MOLDED
281 HEAT SINK TO BE CONNECTED BY PIPE
282 PIPE
291 PIPE INSERTION PORT
292 THROUGH-HOLE FOR PRESSURIZING BOLT 7
311 HEAT PIPE
321 CONTACT PORTION BETWEEN HEAT PIPE AND CASE
322 PIPE PORTION OF HEAT PIPE
323 COOLING FIN PORTION OF HEAT PIPE

The invention claimed is:
1. A power-module device comprising:
a case that has multiple recessed portions; and
multiple semiconductor components,
wherein the case has a first side that is a side of the recessed portion, and a second side opposite the first side,
wherein the case has an edge portion which extends further from the recessed portion,
wherein the multiple semiconductor components are respectively arranged in the respective recessed portions so as to be interposed between cooling devices via the case from the first and second sides, and have a sealing material arranged on the first side of the case, and
wherein the case has an integral structure so that the sealing material can be held on the first side up to at least a portion of the edge portion;
wherein a number of cooling components is one more than the number of the semiconductor components,
wherein the cooling components are connected by a member having a refrigerant passing therein so as to configure one liquid passage, and
wherein the semiconductor component is cooled from both surfaces via the case; and
wherein the cooling components are connected by a connection portion whose length is variable in a pressurizing direction.

2. The power-module device according to claim 1,
wherein the connection portions of the cooling components are connected via an O-ring.

3. A power-module device comprising:
a case that has multiple recessed portions; and
multiple semiconductor components,
wherein the case has a first side that is a side of the recessed portion, and a second side opposite the first side,
wherein the case has an edge portion which extends further from the recessed portion,
wherein the multiple semiconductor components are respectively arranged in the respective recessed portions so as to be interposed between cooling devices via the case from the first and second sides, and have a sealing material arranged on the first side of the case, and
wherein the case has an integral structure so that the sealing material can be held on the first side up to at least a portion of the edge portion;
wherein the semiconductor component and a terminal block support member are arranged on the same plane orthogonal to a pressurizing direction, and
wherein a thickness in the pressurizing direction of the terminal block support member is smaller than a thickness in the pressurizing direction of the semiconductor component.

4. The power-module device according to claim 1,
wherein a pressurizing plate having bending rigidity larger than bending rigidity of the cooling component is arranged outside two cooling components located at a terminal in the cooling components arranged side by side, and
wherein the cooling component is pressurized by the pressurizing plate.

5. The power-module device according to claim 4,
wherein the pressurizing plate is bent in advance, and
wherein an outer surface of the two cooling components located at the terminal in the cooling components whose surfaces are arranged side by side faces a convex surface of the pressurizing plate.

6. The power-module device according to claim 4,
wherein the pressurizing plate is pressurized by a bolt, and the bolt penetrates the pressurizing plate, the cooling component, and a block support member.

* * * * *